(12) United States Patent
Loeda et al.

(10) Patent No.: US 8,319,674 B2
(45) Date of Patent: Nov. 27, 2012

(54) COMPENSATION OF LOOP-DELAY QUANTIZER IN CONTINUOUS-TIME AND HYBRID SIGMA-DELTA ANALOG-TO-DIGITAL MODULATORS

(75) Inventors: Sebastian Loeda, Edinburgh (GB); Gary Hague, Faringdon (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 91 days.

(21) Appl. No.: 12/924,785

(22) Filed: Oct. 5, 2010

(65) Prior Publication Data
US 2012/0062405 A1 Mar. 15, 2012

(30) Foreign Application Priority Data
Sep. 11, 2010 (EP) ..................... 10009466

(51) Int. Cl.
*H03M 3/00* (2006.01)
(52) U.S. Cl. ................. 341/143; 341/155
(58) Field of Classification Search ............ 341/155, 341/143, 156
See application file for complete search history.

(56) References Cited

U.S. PATENT DOCUMENTS 6,462,687 B1 * 10/2002 Eshraghi et al. ............ 341/143
6,967,608 B1 * 11/2005 Maloberti et al. .......... 341/143
7,397,410 B2   7/2008 Yang
7,696,913 B2 * 4/2010 Melanson .................... 341/143

OTHER PUBLICATIONS

"On Low Power Design of Feedforward Continuous-Time Sigma Delta Modulators with Excess Loop Delay," by Xiaolong Yuan et al., 2008 IEEE, 978-1-4244-1684-4/08, pp. 1882-1885.

"A 3-mW 74-dB SNR 2-MHz Continuous-Time Delta-Sigma ADC With a Tracking ADC Quantizer in 0.13-D E μm CMOS," by Lukas Dorrer et al., IEEE Journal of Solid-State Circuits, vol. 40, No. 12, Dec. 2005, pp. 2416-2427.

"Low-Power Approaches to High-Speed Current-Steering Digital-to-Analog Converters in 0.18-D E μm CMOS," by Douglas A. Mercer, IEEE Journal of Solid-State Circuits, vol. 42, No. 8, Aug. 2007, pp. 1688-1698.

"Clock Jitter and Quantizer Metastability in Continuous-Time Delta-Sigma Modulators," by James A. Cherry et al., IEEE Transactions on Circuits and Systems—II: Analog and Digital Signal Processing, vol. 46, No. 6, Jun. 1999, pp. 661-676.

"On the Design of High-Performance Wide-Band Continuous-Time Sigma-Delta Converters Using Numerical Optimization," by Sebastian Loeda et al., IEEE Transactions on Circuits and Systems—I: Regular Papers, vol. 53, No. 4, Apr. 2006, pp. 802-810.

(Continued)

*Primary Examiner* — Brian Young
(74) *Attorney, Agent, or Firm* — Saile Ackerman LLC; Stephen B. Ackerman; Billy Knowels

(57) ABSTRACT

A summing-tracking quantizer additively combines multiple feed-forward outputs of cascaded integrator stages of a sigma-delta analog-to-digital converter with a scaled sampled analog signal, and a delayed scaled analog input signal. The summing tracking quantizer compensates for loop delay within a sigma-delta analog-to-digital converter. A loop delay compensation digital-to-analog converter for a sigma-delta analog-to-digital converter is merged with the voltage reference generator within the summing-tracking quantizer. The summing tracking quantizer selects reference voltages from the voltage reference generator based on a previous digital output code. The summing-tracking quantizer has a matrix switch that receives the previous digital output code and selects the reference voltage for applying to comparators for determining a differential quantization code that is additively combined to the previous digital output code to determine the present digital output code.

64 Claims, 17 Drawing Sheets

OTHER PUBLICATIONS

"A Power Optimized Continuous-Time Delta-Sigma ADC for Audio Applications," by Shanthi Pavan et al., IEEE Journal of Solid-State Circuits, vol. 43, No. 2, Feb. 2008, pp. 351-360.

"A Comparative Study on Excess-Loop-Delay Compensation Techniques for Continuous-Time Sigma-Delta Modulators," by Matthias Keller et al., IEEE Transactions on Circuits and Systems—I: Regular Papers, vol. 55, No. 11, Dec. 2008, pp. 3480-3487.

"A Novel Higher Order Interpolative Modulator Topology for High Resolution Oversampling A/D Converters," by Wai Laing Lee, Jun. 1987, MSc thesis, MIT, pp. 1-135.

* cited by examiner

FIG. 1 – Prior Art

|  | Code(k) | 0 | 1 | 2 | 3 | 4 | 5 | 6 | 7 |
|---|---|---|---|---|---|---|---|---|---|
| 207a | Q1P | 1 | 2 | 3 | 4 | 5 | 6 | 7 | 8 |
|  | Q1N | 13 | 12 | 11 | 10 | 9 | 8 | 7 | 6 |
| 207b | Q2P | 0 | 1 | 2 | 3 | 4 | 5 | 6 | 7 |
|  | Q2N | 14 | 13 | 12 | 11 | 10 | 9 | 8 | 7 |
| 207c | Q3P | 'b0 | 0 | 1 | 2 | 3 | 4 | 5 | 6 |
|  | Q3N | 'b1 | 14 | 13 | 12 | 11 | 10 | 9 | 8 |
| 207d | Q4P | 'b0 | 'b0 | 0 | 1 | 2 | 3 | 4 | 5 |
|  | Q4N | 'b1 | 'b1 | 14 | 13 | 12 | 11 | 10 | 9 |

|  | Code(k) | 8 | 9 | 10 | 11 | 12 | 13 | 14 | 15 |
|---|---|---|---|---|---|---|---|---|---|
| 207a | Q1P | 9 | 10 | 11 | 12 | 13 | 14 | 'b1 | 'b1 |
|  | Q1N | 5 | 4 | 3 | 2 | 1 | 0 | 'b0 | 'b0 |
| 207b | Q2P | 8 | 9 | 10 | 11 | 12 | 13 | 14 | 'b1 |
|  | Q2N | 6 | 5 | 4 | 3 | 2 | 1 | 0 | 'b0 |
| 207c | Q3P | 7 | 8 | 9 | 10 | 11 | 12 | 13 | 14 |
|  | Q3N | 7 | 6 | 5 | 4 | 3 | 2 | 1 | 0 |
| 207d | Q4P | 6 | 7 | 8 | 9 | 10 | 11 | 12 | 13 |
|  | Q4N | 8 | 7 | 6 | 5 | 4 | 3 | 2 | 1 |

'b0 = GND
'b1 = VDD $Vref(i)$

FIG. 10

| | Code(k) | 0 | 1 | 2 | 3 | 4 | 5 | 6 | 7 |
|---|---|---|---|---|---|---|---|---|---|
| 707a | QaP | 1 | 1 | 1 | 1 | 5 | 5 | 5 | 5 |
| | QaN | 13 | 13 | 13 | 13 | 9 | 9 | 9 | 9 |
| 707b | QbP | 0 | 0 | 0 | 4 | 4 | 4 | 4 | 8 |
| | QbN | 14 | 14 | 14 | 10 | 10 | 10 | 10 | 6 |
| 707c | QcP | 'b0 | 'b0 | 3 | 3 | 3 | 3 | 7 | 7 |
| | QcN | 'b1 | 'b1 | 11 | 11 | 11 | 11 | 7 | 7 |
| 707d | QdP | 'b0 | 2 | 2 | 2 | 2 | 6 | 6 | 6 |
| | QdN | 'b1 | 12 | 12 | 12 | 12 | 8 | 8 | 8 |

| | Code(k) | 8 | 9 | 10 | 11 | 12 | 13 | 14 | 15 |
|---|---|---|---|---|---|---|---|---|---|
| 707a | QaP | 9 | 9 | 9 | 9 | 13 | 13 | 13 | 13 |
| | QaN | 5 | 5 | 5 | 5 | 1 | 1 | 1 | 1 |
| 707b | QbP | 8 | 8 | 8 | 12 | 12 | 12 | 12 | 'b1 |
| | QbN | 6 | 6 | 6 | 2 | 2 | 2 | 2 | 'b0 |
| 707c | QcP | 7 | 7 | 11 | 11 | 11 | 11 | 'b1 | 'b1 |
| | QcN | 7 | 7 | 3 | 3 | 3 | 3 | 'b0 | 'b0 |
| 707d | QdP | 6 | 10 | 10 | 10 | 10 | 14 | 14 | 14 |
| | QdN | 8 | 4 | 4 | 4 | 4 | 0 | 0 | 0 |

FIG. 13

| | Code k | 0 | 1 | 2 | 3 | 4 | 5 | 6 | 7 |
|---|---|---|---|---|---|---|---|---|---|
| 745 | Qa | Q1 | Q4 | Q3 | Q2 | Q1 | Q4 | Q3 | Q2 |
| | Qb | Q2 | Q1 | Q4 | Q3 | Q2 | Q1 | Q4 | Q3 |
| | Qc | Q3 | Q2 | Q1 | Q4 | Q3 | Q2 | Q1 | Q4 |
| | Qd | Q4 | Q3 | Q2 | Q1 | Q4 | Q3 | Q2 | Q1 |

| | Code k | 8 | 9 | 10 | 11 | 12 | 13 | 14 | 15 |
|---|---|---|---|---|---|---|---|---|---|
| 745 | Qa | Q1 | Q4 | Q3 | Q2 | Q1 | Q4 | Q3 | Q2 |
| | Qb | Q2 | Q1 | Q4 | Q3 | Q2 | Q1 | Q4 | Q3 |
| | Qc | Q3 | Q2 | Q1 | Q4 | Q3 | Q2 | Q1 | Q4 |
| | Qd | Q4 | Q3 | Q2 | Q1 | Q4 | Q3 | Q2 | Q1 |

FIG. 14

COMPENSATION OF LOOP-DELAY QUANTIZER IN CONTINUOUS-TIME AND HYBRID SIGMA-DELTA ANALOG-TO-DIGITAL MODULATORS

BACKGROUND OF THE INVENTION

1. Field of the Invention

This invention relates generally to Sigma-Delta Analog-to-Digital Converters. More particularly, this invention relates to continuous-time or hybrid Sigma-Delta Analog-to-Digital Converters. Even more particularly, this invention relates to circuits and methods for feedback delay compensation and signal cancellation within a quantizer of Sigma-Delta Analog-to-Digital Converters.

2. Description of Related Art

Continuous-time Sigma-delta analog-to-digital modulators or converters (CT SDM ADCs) are sensitive to delays in the feedback path. The delay is introduced by the quantizer and any circuitry in the feedback path such as data weighted averaging (DWA) or digital-to-analog converter (DAC) switching delays. CT SDM ADCs are also sensitive to signal dependent delays resulting from, for example, quantizer metastability [Cherry, et al.]. Furthermore the signal dependency in DAC switch timing [Mercer] can cause an increase in clock jitter induced noise.

In Dörrer, et al., a power and area efficient implementation of a CT SDM ADC minimizes the feedback delay by incorporating the DWA within the quantizer. Unfortunately this approach puts a tight timing requirement constraint on the quantizer and limits the DAC mismatch noise shaping to relatively simple implementations such as first-order DWA. Furthermore, the quantizer metastability is only partially alleviated with a fast switched capacitor quantizer and the signal dependent DAC switch timing effects are not dealt with. All of these problems can be resolved by latching the quantizer output to a fixed delay. However, the corresponding fixed delay in the feedback will have a detrimental effect on performance and stability to the CT SDM ADC; especially with non-return to zero (NRZ) DAC pulses, where the delay is known as excess loop delay.

The effect of excess loop delay in CT SDM ADCs is compensated with the introduction of free coefficients to the modulator's loop transfer function either through a zero in the CT filter or with an additional feedback DAC. The effect of the zero is limited by the finite gain-bandwidth (GBW) of the amplifiers in the filter, while the additional DAC increases the filter output signal, effectively reducing the dynamic range of the ADC. The zero approach is costly in power as a larger GBW is required to have a robust loop while the DAC approach is costly in die area, power and dynamic range [Keller, et al.].

BIBLIOGRAPHY

"A Comparative Study on Excess-Loop-Delay Compensation Techniques for Continuous-Time Sigma—Delta Modulators", Keller, et al.; IEEE Trans. on Circuits and Systems I: Reg. Papers, Volume 55, Issue 11, pp: 3480-3487, December 2008.

"A novel higher order interpolative modulator topology for high resolution over-sampling ND converters", Lee, MSc thesis, MIT, June 1987.

"A Power Optimized Continuous-Time Sigma-delta ADC for Audio Applications", Pavan, et al., IEEE journal of solid-state circuits, volume 43, issue 2, February 2008.

"A 3-mW 74-dB SNR 2-MHz Continuous-Time Delta-Sigma ADC With a Tracking ADC Quantizer in 0.13-um CMOS", Differ, et al., IEEE transactions on Sold-State Circuits, Volume 40, issue 12, pp: 2416-2427, December 2005.

"On the Design of High-Performance Wide-Band Continuous-Time Sigma—Delta Converters Using Numerical Optimization", Loeda, et al., IEEE Transactions on Circuits and Systems-I: Regular Papers, volume. 53, issue 4, Apr. 2006.

"Clock jitter and quantizer metastability in continuous-time delta-sigma modulators", Cherry, et al., IEEE Transactions on Circuits and Systems II: Analog and Digital Signal Processing, Volume: 46, Issue: 6, pp: 661-676, June 1999, "Low-Power Approaches to High-Speed Current-Steering Digital-to-Analog Converters in 0.18-um CMOS", Mercer, IEEE JSSC, Vol. 42, Issue 8, pp:1688-1698, August 2007

SUMMARY OF THE INVENTION

An object of this invention is to provide a quantizer that additively combines multiple feed-forward outputs of cascaded integrator stages of a sigma-delta analog-to-digital converter.

Another object of this invention is to provide a quantizer that compensates for excess loop delay within a sigma-delta analog-to-digital converter.

Further, another object of this invention is to provide a quantizer that merges a comparator voltage reference string with a loop delay compensation digital-to-analog converter for a sigma-delta analog-to-digital converter.

Still further, another object of this invention is to provide a quantizer that selects reference voltages based on a digital output code for determining the present digital output code of a sigma-delta analog-to-digital converter.

To accomplish at least one of these objects, an embodiment of a sigma-delta analog-to-digital converter includes a plurality of cascaded integrator stages that receives a difference signal that is a difference between an analog input signal and a digital-to-analog converted version of a digital output code of a previous analog-to-digital conversion of a sample of the analog input signal. The integrated analog output signals of each of the cascaded integrator stages are the inputs to a tracking-summing-compensating quantizer that determines the digital output code for each continuous-time integration of the analog input signal. The tracking-summing-compensating quantizer includes a summation device that receives integrated analog input signals from cascaded integrator stages of the sigma-delta analog-to-digital converter. The summation device further receives a delayed analog input signal to remove the presence of signal through the cascaded integrator stages.

The tracking-summing-compensating quantizer has a voltage level generation circuit that establishes a plurality of reference voltage levels that are connected to a switching matrix to select the reference voltage levels for comparison with the sampled outputs of the cascaded integrator stages to determine a digital output code of the sigma-delta analog-to-digital converter representative of an amplitude of an analog input signal of the sigma-delta analog-to-digital converter.

A loop delay compensation digital-to-analog converter generates an analog compensation feedback signal to the summation device to compensate for loop delay. The loop delay compensation digital-to-analog converter is merged with the switching matrix such that the previous digital output code determines the analog compensation feedback signal.

The summation device has a plurality of switched capacitor circuits such that each receives one of the integrated analog input signals, the delayed and non-delayed analog input signals, the analog compensation feedback signal, and the selected reference voltage levels of the plurality of reference voltage levels. The outputs of the plurality of switched capacitor circuits are connected to provide a summation signal that is the additive combination of the integrated input signals, the delayed analog input signals, analog compensation feedback signal, and the selected reference voltage levels of the plurality of reference voltage levels.

The tracking-summing-compensating quantizer includes a plurality of comparators connected to receive the summation signal and from the summation signal determines the digital output code of the sigma-delta analog-to-digital converter. In some embodiments the plurality of comparators is limited to a number of comparators that determine a level difference of the analog input signal from a previously determined level of the analog input. In some, embodiments the tracking-summing-compensating quantizer includes four comparators that determine if the analog input signal has varied by $-2$, $-1$, $0$, $+1$, $+2$ of the reference levels from the previous.

The tracking-summing-compensating quantizer has an accumulator that additively combines a level difference code to the previous digital output code to determine the current digital output code. The accumulator includes a register for retaining the current digital output code to be fed to the voltage level generation circuit for determining the reference voltage levels to be connected to the summation device for a next sampling of the analog input signal.

In some embodiments, the switching matrix includes a plurality of switching devices arranged in rows and columns with a first terminal of the plurality of switching devices on each column is connected to the summation devices and thus to one comparator input. A second terminal of the plurality of switching devices on each row is connected to one of the reference voltage levels. A control terminal of the plurality of switching devices is connected to receive a control signal representing one of the digital output codes from the register included in the accumulator retaining the previous digital output code. The reference voltage levels connected to the summation devices and thus to the comparators are selected according to the following function:

$$Q_{Mp} = \text{ref}[k - Q_n + 2]$$

$$Q_{Mn} = \text{ref}[R_N - 1 - k + Q_N - 2]$$

Where:
k is the previous digital output code.
$R_N$ is the number of the plurality voltage references.
N is the number of the plurality of comparators where $N \in \{1 \ldots R_N\}$.
$Q_M$ is the $M^{th}$ comparator where $M \in \{1 \ldots N\}$.
$Q_{Mp}$ is an identifier of the $M^{th}$ positive comparator.
$Q_{Mn}$ is an identifier of the $M^{th}$ negative comparator.

In other embodiments, the switching matrix includes a reduced plurality of switching devices arranged in rows and columns where each row has two switching devices on two columns and the remaining columns do not including switching devices. A first terminal of the plurality of switching devices on each column is connected to the summation devices and thus to one comparator input. A second terminal of the plurality of switching devices on each row is connected to one of the reference voltage levels. A control terminal of the plurality of switching devices is connected to receive a control signal representing at least one of the digital output codes from the register included in the accumulator. The reference voltage levels connected to the summation devices and thus to the comparators are selected according to the following mapping function:

$$Q_M \text{ maps to comparator } Q_{1+\{M-1-k\} \text{ Modulus } N}.$$

Where:
k is the previous digital output code.
N is the number of the plurality of comparators where $N \in \{1 \ldots R_N\}$.
$Q_M$ is the $M^{th}$ comparator where $M \Delta \{1 \ldots N\}$.

In those embodiments including a reduced plurality of switching devices, the tracking-summing-compensating quantizer includes a selector for mapping the outputs of the comparators to form the level difference code for applying to the accumulator.

In other embodiments, the loop delay compensation digital-to-analog converter as merged with the switching matrix uses a pair voltage reference levels selected by the previous digital output code and a pair of reference voltage levels adjacent to the pair of reference voltage levels selected by the previous digital output code. Each pair of the reference voltage levels acts as a differential reference for a differential signal pair of the analog input signal. Each of the differential reference voltage pairs is attenuated by a factor of two and the corresponding reference voltage levels of the differential pairs are additively combined to form the analog compensation feedback signal.

In other embodiment, an analog-to-digital conversion apparatus performs continuous-time Sigma-Delta Analog-to-Digital Conversion employing a method that begins with summing an analog input with a feedback analog signal from a previous sample digital output code to form a quantization difference signal. The quantization difference signal is integrated through multiple orders of the integration.

Differentially separated reference voltage levels are provided from a voltage reference generator that generates multiple reference voltage levels based on the number of increments that define a range of voltage increments that can be converted by the analog-to-digital conversion apparatus per sample. A loop delay compensation feedback signal is generated from the multiple reference voltage levels based on the previous digital output code. A scaled and delayed feed forward signal is generated from the analog input signal.

The integrated quantization difference signal, the differentially separated reference voltage levels, the loop delay compensation feedback signal, and the scaled and delayed feed forward signal are summed and sampled. The digital output code is determined from the summed and sampled result. The digital output code is retained for a next determining of the digital output code from the quantization difference signal.

BRIEF DESCRIPTION OF THE DRAWINGS

FIG. 10 is a table of the switch matrix connectivity of FIG. 9 for the reference voltage levels to the quantizing circuits.

FIG. 13 is a table of the switch matrix connectivity of FIG. 12a for the reference voltage levels to the quantizing circuits of FIG. 11.

FIG. 14 is a table for mapping the summing-tracking-compensating quantizers of FIG. 11 to the appropriate digit locations for determining an output code of the summing continuous-time Sigma-Delta Analog-to-Digital Converter.

DETAILED DESCRIPTION OF THE INVENTION

Figure 1:
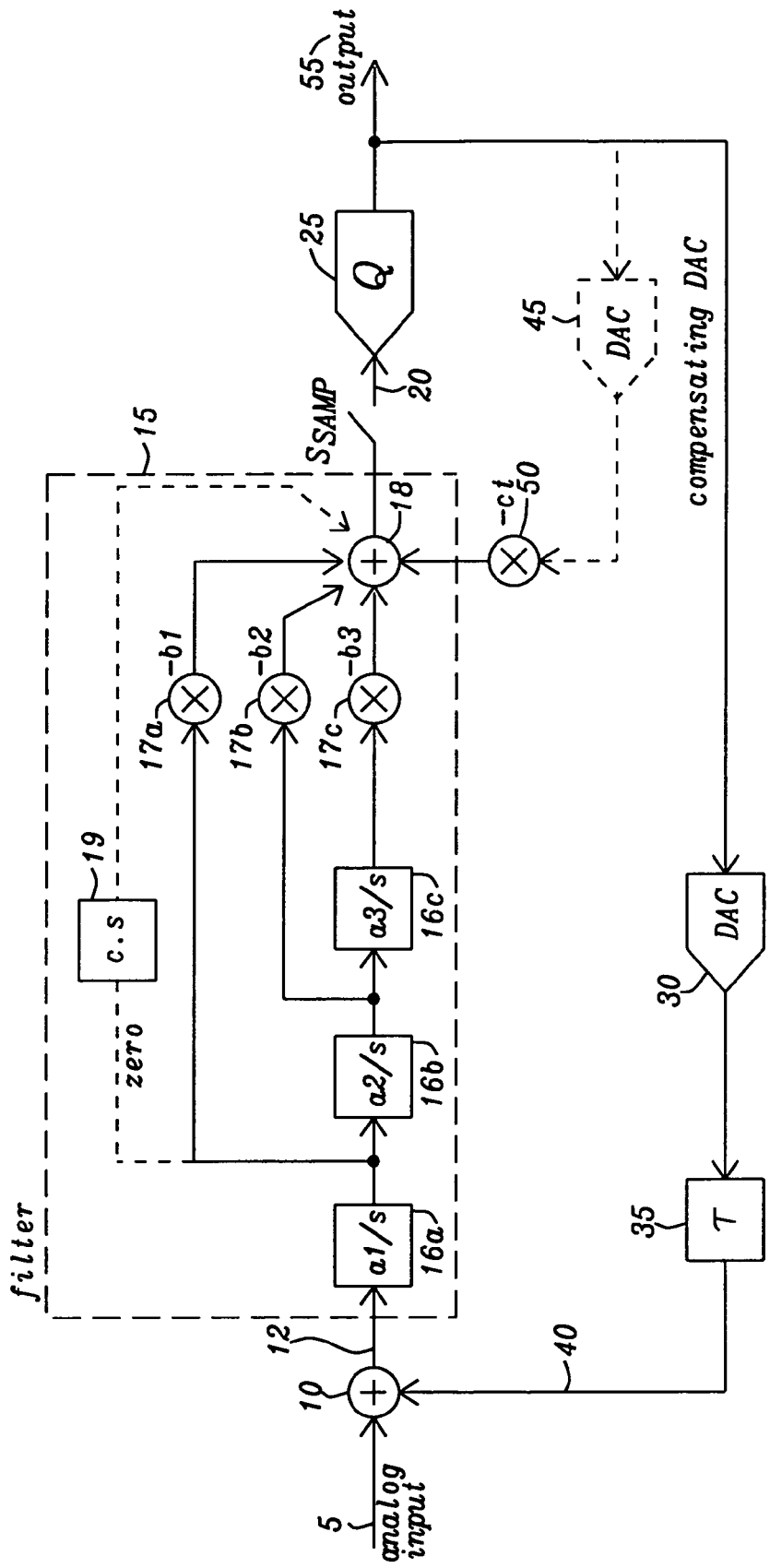
FIG. 1 is a schematic diagram of a continuous-time Sigma-Delta Analog-to-Digital Converter of the prior art.

FIG. 1 illustrates a continuous-time Sigma-Delta Analog-to-Digital Converter of the prior art and depicts the compensation options in a typical non-tracking Analog-to-Digital Converter of the prior art. An analog input signal 5 is applied to summing circuit 10 where it is additively combined with an analog feedback signal 40 to generate a difference quantization signal 12. The difference quantization signal 12 is the differential change between a current level of the analog input signal 5 and a previous level of the analog signal as sampled to form the digital output code 55.

The difference quantization signal 12 is transferred to the input of an integration filter 16. The integration filter 15 is typically implemented as a weighted feed forward sum of the outputs of cascaded first order active integrator stages 16a, 16b, and 16c where local feedback paths may be used for low oversampling ratios. In this embodiment, as illustrated, there are three stages 16a, 16b, and 16c of the first order active integrator. The integration filter 15 is alternately implemented from a hybrid combination of continuous-time (CT) and discrete-time (DT) components. The outputs of each of the first order active integrator stages 16a, 16b, and 16c are the inputs to the scaling circuits 17a, 17b, and 17c. The scaled integrated quantization signals at the outputs of the scaling circuits 17a, 17b, and 17c are the inputs to the summing circuit 18. The scaled integrated quantization signals are additively combined to form the integrated quantization signal that is then sampled by the sampling switch 20. The sample of the integrated quantization signal is then applied to the quantizer 25 which digitizes the sampled integrated quantization signal to determine the digital output code 55. The digital output code 55 is transferred to external circuitry for further processing. A portion of the digital output code 55 is transferred to the input of a digital-to-analog converter circuit 30 that converts the digital output code 55 back to an analog signal that is subsequently applied to the input of the summing circuit 10.

The circuit delay in the feedback of the Continuous-Time Sigma-Delta analog-to-digital converter shifts its loop response away from what it was originally intended [Loeda, et al.]. This delay is defined as the time difference between the analog-to-digital converter sampling time and the feedback digital-to-analog converter 30 producing the corresponding output change that is illustrated as the delay element (τ) 35. The effect of the delay element (τ) 35 is particularly problematic when non-return-to-zero (NRZ) pulse shapes are used in the feedback to reduce bandwidth and clock jitter requirements. With a NRZ feedback digital-to-analog converter 30 output, the delay pushes a feedback digital-to-analog converter 30 output from the current clock to cycle into the next clock cycle which may lead the loop becoming unstable. The effect of the loop delay from the delay element (τ) 35 may be compensated with the addition of free coefficients to the loop either through a zero pole filter 19 in the continuous-time filter or with an additional feedback digital-to-analog converter 45. The output of the additional feedback digital-to-analog converter 45 is applied to a scaling circuit 50 and then applied directly to the summing circuit 18.

Only the zero pole filter 19 in the continuous time filter structure of the integration filter 15, or the digital-to-analog converter 45, will fully restore from the effect of loop delay. The effectiveness of the addition of a zero pole filter 19 to a continuous-time filter is limited by the finite gain-bandwidth (GBW) of its amplifiers, while the additional feedback digital-to-analog converter 45 is costly in die area and power. In order to achieve a robust loop with a zero in the filter, the gain-bandwidth of the amplifiers must be increased, costing power, while the addition of a feedback digital-to-analog converter 45 increases the filter output signal reducing the dynamic range.

The quantizer 25 is typically implemented by comparing the integrated quantization signal to a set of reference voltages. The quantizer 25 can also be implemented by comparing the charge from sampling and capacitively coupling the integrated quantization signal to the charge from sampling and capacitively coupling a set of reference voltages [Pavan, et al.]. The charge based comparator is common in discrete time switched capacitor (SC) implementations of Sigma-Delta analog-to-digital converters where the integrated quantization signal is also performed with charge. The charge sum must be performed at the quantizer reference level for each comparator in the quantizer 25, but this may be area costly if the quantizer 25 has many output bits.

The difference quantization signal 12 that is the input to the integration filter 15 is the error difference between the analog input signal 5 and the analog feedback signal 40. The closed loop seeks to reduce the error signal. Therefore the weighted feed-forward implementation of the integration filter 15 achieves a full scale output by minimizing the sum of the cascaded first order active integrator stages 16a, 16b, and 16c [Lee].

Figure 2:
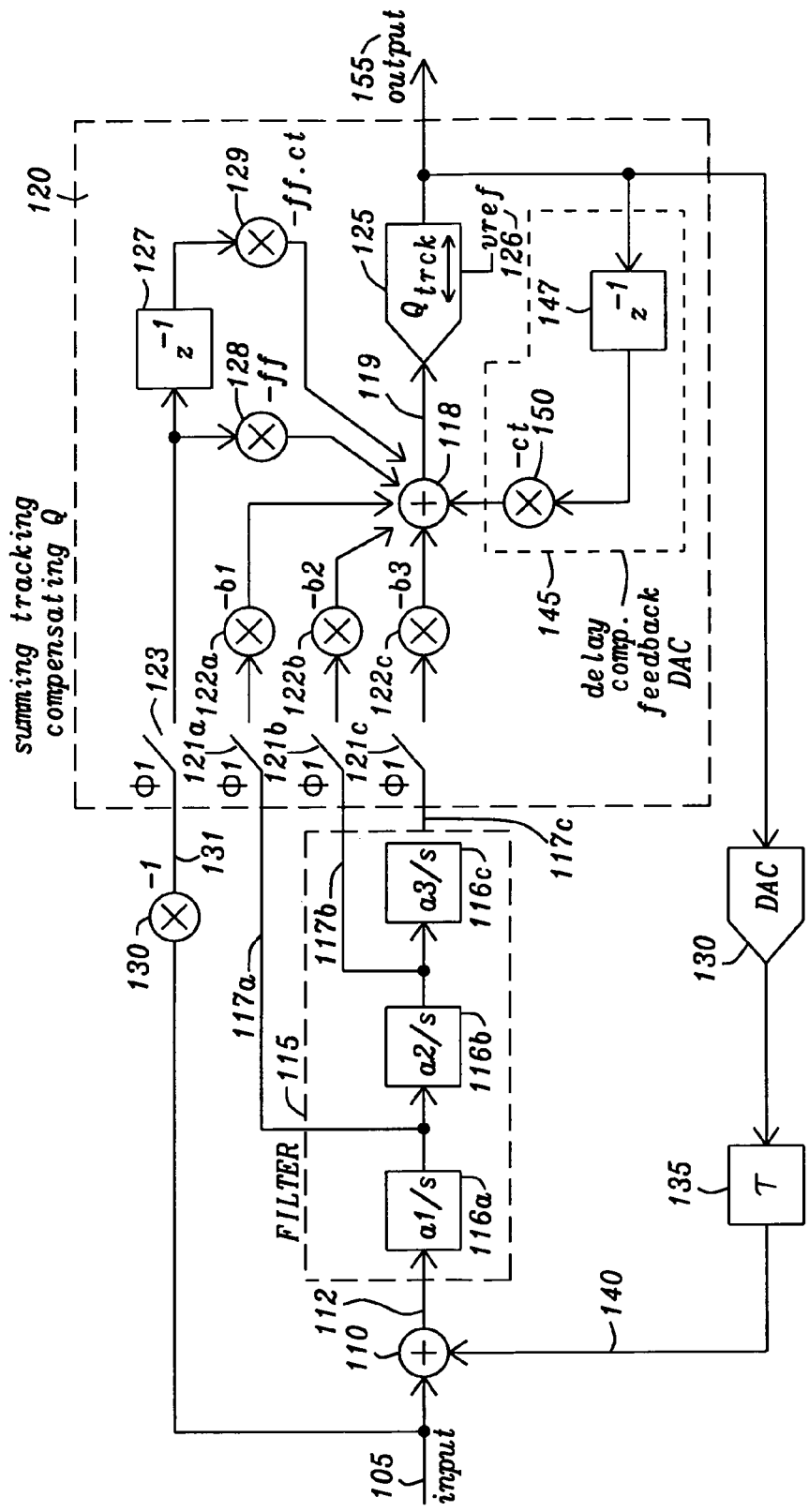
FIG. 2 is a schematic diagram of an embodiment of a summing continuous-time Sigma-Delta Analog-to-Digital Converter including a summing-tracking-compensating quantizer.

In a Sigma-Delta analog-to-digital converter there must be as many reference voltages as there are comparator thresholds, but because of the oversampling nature of Sigma-Delta Modulators, only the output of a few comparators actually changes from sample to sample. As shown in FIG. 2 and described in detail hereinafter, a tracking quantizer 120 reduces the comparator count by only detecting the change in quantizer 120 output from sample to sample and by accumulating the difference digitally. The accumulated value also sets the references that the comparators will be connected to during the next sample, and in effect the references track the change in the weighted filter sum output. The mean voltage between the current tracking references is in fact the voltage equivalent to the previous quantized value of the integrated quantization signal which will be subtracted from the current sampled value at the quantizer 120 input.

FIG. 2 is a schematic diagram of an embodiment of a summing continuous-time Sigma-Delta Analog-to-Digital Converter including a summing-tracking-compensating quantizer. Some embodiments of this invention combine the charge summing switched-capacitor quantizer with the tracking quantizer such that an area efficient charge summation can be performed in a limited number of quantizers. While the integrator output voltages are minimized by the weighted feed-forward paths, the full scale summation is performed with charge, thus reducing the impact of an increased output signal with feedback digital-to-analog converter circuit compensation. A sampled and delayed analog input signal is fed-forward to the charge summer to remove the presence of signal through the integrators, leaving them only to process quantization noise and reducing the integrator output range further. Some inherent antialiasing at the edge of the band is lost due to the feed-forward path but this effect is limited.

Referring to FIG. 2, the analog input signal 105 is applied to the summing circuit 110 where it is additively combined with the analog feedback signal 140 to generate a difference quantization signal 112. The difference quantization signal 112 is the differential change between a current level of the analog input signal 105 and a previous level of the analog signal as sampled to form the digital output code 155.

The difference quantization signal 112 is transferred to the input of an integration filter 115. The integration filter 115 is implemented as weighted feed forward outputs of cascaded first order active integrator stages 116a, 116b, and 116c. In this embodiment, as illustrated, there are three stages 16a, 16b, and 16c of the first order active integrator within the integration filter 115. The integration filter 115 may be implemented as other appropriate filter structures that are known in the art.

The outputs of each of the first order active integrator stages 116a, 116b, and 116c are the integrated difference quantization signals 117a, 117b, and 117c that are the inputs to the summing-tracking-compensating quantizer circuit 120. The analog input signal 105 is applied to the inversion circuit 130 and the inverse analog input signal 131 is applied to the summing-tracking-compensating quantizer circuit 120. The inverse analog input signal 131 is applied to the sampling switch 123 and the outputs of each of the first order active integrator stages 116a, 116b, and 116c are applied respectively to the sampling switches 121a, 121b, and 121c. The first clock phase Φ1 controls the sampling rate of the inverse analog input signal 131 and the outputs of each of the first order active integrator stages 117a, 117b, and 117c.

The sampled integrated difference quantization signals are the inputs to the scaling circuits 122a, 122b, and 122c. The delayed inverse analog input signal is the input to a sample unit delay device 127 to generate a delayed version of the sampled analog signal. The sampled analog signal is the input to the scaling circuit 128 and the delayed sampled analog signal is the input to the scaling circuit 129. The scaled sampled integrated difference quantization signals, the scaled sampled analog signal, and the delayed scaled analog input signal are the inputs to the summing circuit ⊕ 118. The output of the summing circuit ⊕ 118 is the quantization noise signal 119 and is the input to the tracking quantization circuit 125. A reference voltage source is applied to the tracking quantization circuit 125 to develop the reference voltages necessary for determining the digital output code 155 representing the amplitude of the analog input signal 105. The digital output code 155 is applied to the sample unit delay circuit 147 that generates an analog version of the previous sampling of the analog input. The analog version of the previous sampling of the analog input is applied to the scaling circuit 150 and the output of the scaling circuit 150 is applied to the summing circuit ⊕ 118. The sample unit delay circuit 147 and the scaling circuit 150 combine to the form the delay compensation digital-to-analog circuit 145. It should be noted that that any kT/C noise, distortion or sampling noise introduced by the switches will be attenuated by the loop, including those of the input feed-forward path.

The quantization noise signal 119 is only expected to change digital output code 155 by a limited number of output codes from sample to sample. The rate of change in the input signal is also limited by the over-sampling ratio (OSR). As shown in DOrrer, et al., the following inequality must be satisfied for two tracking mid-rise comparators (i.e. ±1) not to saturate:

$$N < OSR \times 2/\pi$$

where:
N is the number of comparator.
OSR is the over-sampling ratio
Where:

$$OSR = \frac{f_s}{2f_0}.$$

Where:
$f_s$ is the sampling frequency and
$f_0$ is the bandwidth of the analog input signal
This assumes a full scale input signal that is limited to the bandwidth of fs/2/OSR Hz.

Without a loss of generality, it is assumed that the quantization noise signal 119 will change the digital output code 115 by ±1 from sample to sample in a mid-rise quantizer transfer function with an OSR of 64 and N=16 levels or 15 references. In this case two comparators are sufficient to implement a tracking quantizer 125 to deal with signal and quantization noise, but another two are added for overflow detection. Note that in a mid-tread quantizer transfer function, three comparators would achieve an equivalent functionality. The summation of charge is only limited to those four mid-rise quantizers.

In the embodiments, the reference voltage level is subtracted from the weighted sum input as charge. The reference resistor string in itself functions as a digital-to-analog converter. This allows it to be reused for the feedback DAC compensation. In a mid-tread quantizer, the equivalent input voltage for an output code is defined by the tracking middle reference voltage but in the case of a mid-rise quantizer the equivalent input voltage sits between the two middle references. In some embodiments, the reference voltage resistor string is simply broken into halves to generate the mid-level reference. In other embodiments the charge of ½ of the immediate lower reference voltage level and ½ the charge of the immediate upper reference voltage level is added to get the equivalent reference voltage representing a designated digital output code 155.

The use of reference voltage resistor string having the resistors divided in half is area inefficient and the mismatches between the mid-points in the reference resistors are not accounted for by the quantization noise shaping. So the embodiments employing the addition of the ½ charge from the immediate upper reference voltage level and immediate lower reference voltage level of the reference voltage resistor string is the preferable solution.

Figure 3:
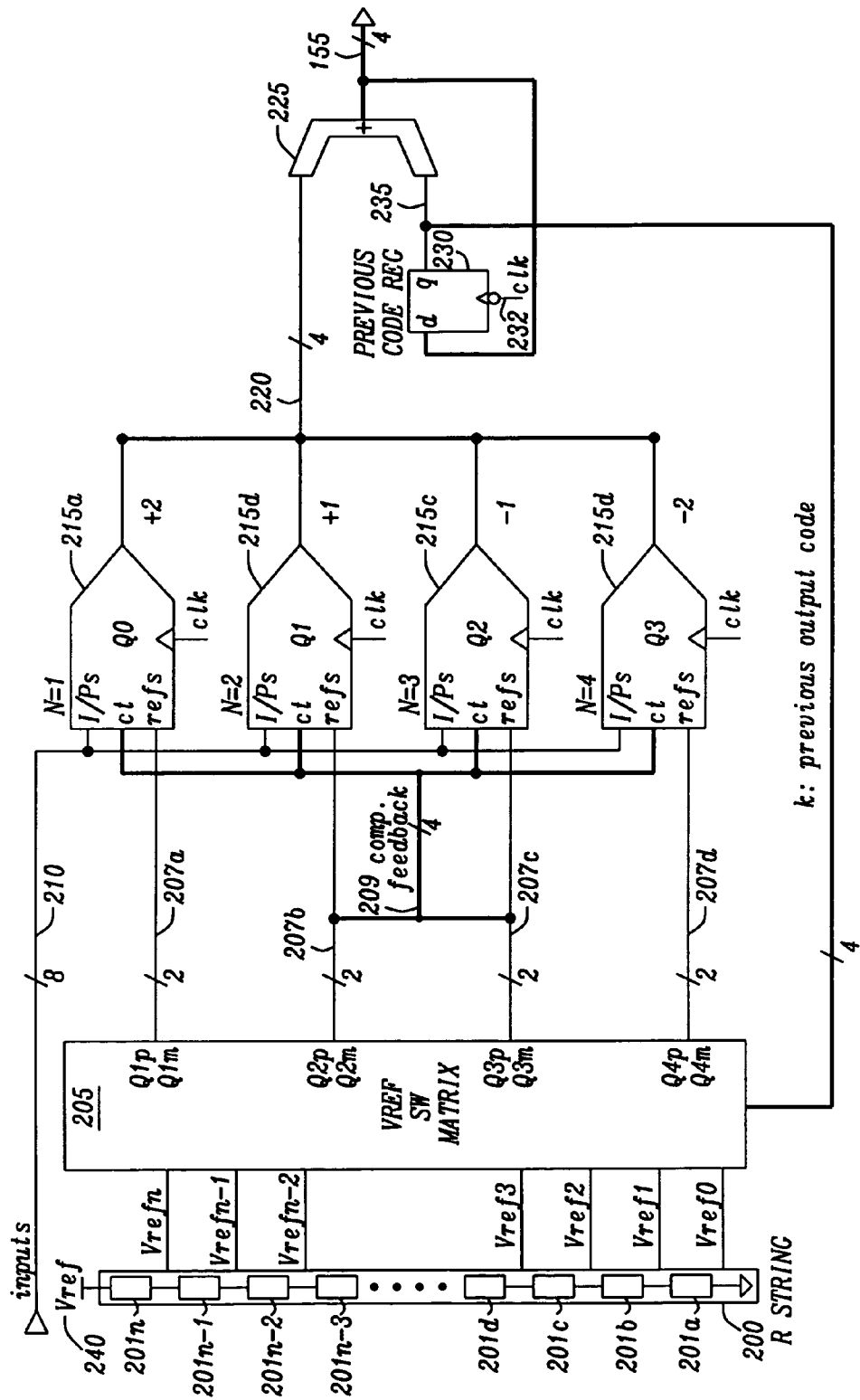
FIG. 3 is a schematic diagram of an embodiment of a summing-tracking-compensating quantizer.

FIG. 3 is a schematic diagram of an embodiment of a summing-tracking-compensating quantizer. Referring now to FIG. 3 for a discussion of the summing-tracking-compensating quantizer 120, the reference voltage generator 200 consists of a resistor string 201a, 201b, ..., 201n connected between the ground reference voltage level and the reference voltage power supply 240. The resistor string 201a, 201b, 201n forms a voltage divider such that at the terminals separating each of the resistors of the resistor string 201a, 201b, ..., 201n provides one of the reference voltages Vref0, Vref1, Vref2, ..., Vrefn for the comparator circuits 215a, 215b, 215c, and 215d.

As noted above, the quantization noise 119 will change the digital output code 115 by ±1 from sample to sample and therefore some embodiments of this invention employ the four comparator circuits 215a, 215b, 215c, and 215d to develop the differential change from sample to sample of the amplitude of the input analog signal. The comparator circuits 215a and 215d provide the overflow information in terms of whether the differential change is too large. The comparator circuits 215b and 215c provide whether the differential change in the quantization noise signal 119 will change the digital output code 115 by ±1 or have no change. The inputs 210 to the comparator circuits 215a, 215b, 215c, and 215d are the integrated difference quantization signals 117a, 117b, and 117c and the inverse analog input signal 131 of FIG. 2.

The terminals of the resistor string 201a, 201b, ..., 201n that provide the reference voltages Vref0, Vref1, Vref2, ..., Vrefn are connected to the inputs of the voltage reference switching matrix circuit 205. The voltage reference switching matrix circuit 205 receives the previous digital output code 235 that controls the selection of the reference voltages Vref0, Vref1, Vref2, ..., Vrefn to transferred to the reference voltage output terminals 207a, 207b, 207c, and 207d of the voltage reference switching matrix circuit 205 and then to the reference inputs of the four comparator circuits 215a, 215b, 215c, and 215d. The two center reference voltage output terminals 207b and 207c are combined employing the addition of the ½ charge from the immediate upper reference voltage level 207b and immediate lower reference voltage level 207c of the reference voltage resistor string 201a, 201b, ..., 201n as selected by the voltage reference switching matrix circuit 205. This combination provides the delay compensation feedback digital-to-analog converter output signal 209. The delay compensation feedback digital-to-analog converter output signal 209 is distributed to each of the delay compensation inputs of the four comparator circuits 215a, 215b, 215c, and 215d.

The input signals 210 are compared to the reference voltages present on the reference voltage output terminals 207a, 207b, 207c, and 207d to determine the difference quantization code 220 that is the output of the four comparator circuits 215a, 215b, 215c, and 215d. The difference quantization code 220 is applied to one set of inputs of the summation circuit 225 and the previous digital output code 235 is applied to the second set of inputs of the summation circuit to generate the digital output code is 155 representative of the amplitude of the analog input signal 105 of FIG. 2. The current digital output code 155 is retained by the previous code register 230 when the clock signal 232 is activated. The retained current digital output code becomes the previous digital output code 235 during a following sampling of the quantized signals.

Figure 4:
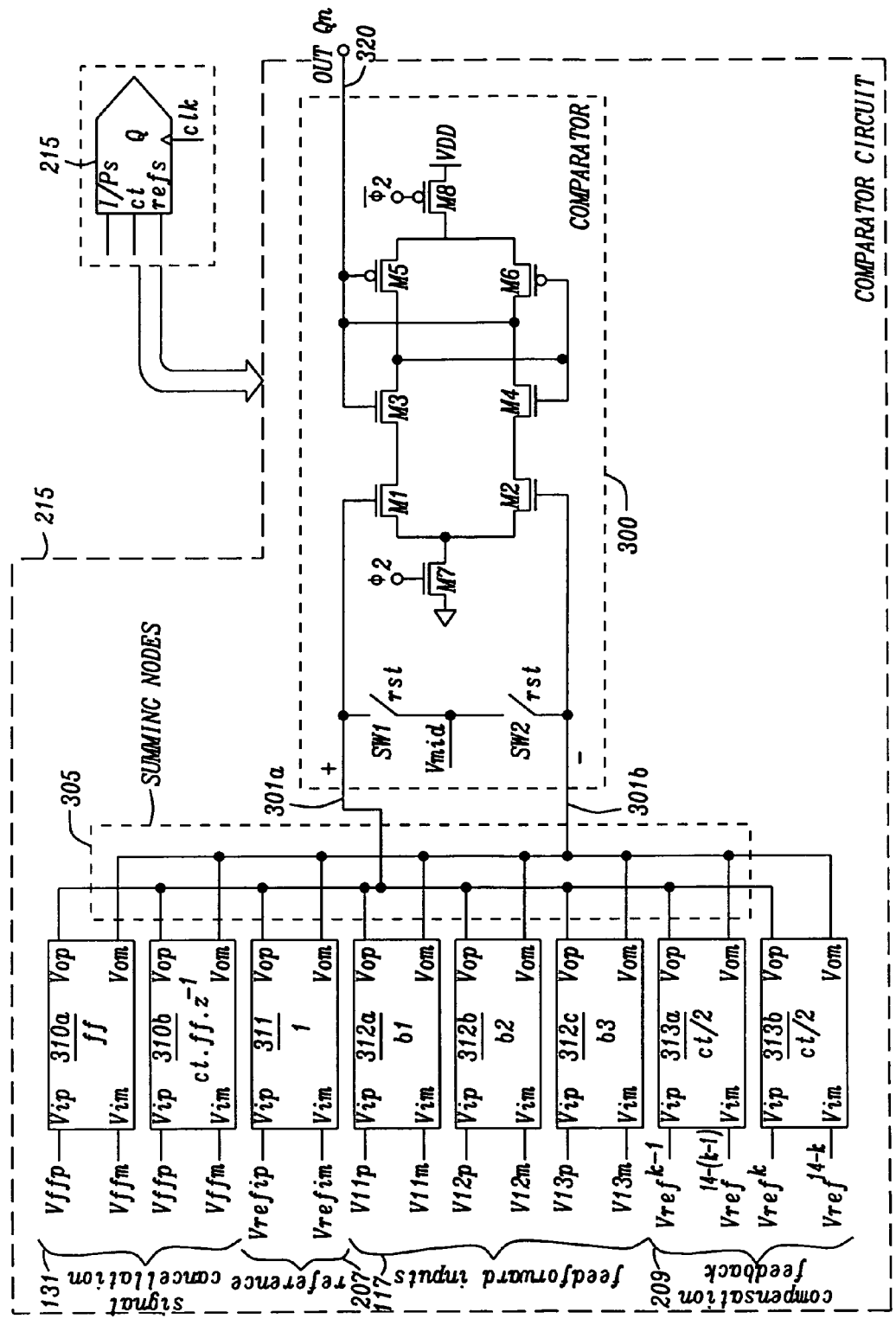
FIG. 4 is a schematic diagram of an embodiment of a quantizing circuit incorporated in the summing-tracking-compensating quantizer of FIG. 3.

FIG. 4 is a schematic diagram of an embodiment of a quantizing circuit incorporated in the summing-tracking-compensating quantizer of FIG. 3. Refer now to FIG. 4 for a discussion of a summing-tracking-compensating quantizer 215. The inverse analog input signal 131 is applied to the switched capacitor charge summing blocks 310a and 310b. The reference voltages 207 $Vref_{ip}$ and $Vref_{im}$ assigned to the particular summing-tracking-compensating quantizer 215 are the inputs to the switched capacitor charge summing block 311. The feed-forward integrated difference quantization signals 117 (the integrated difference quantization signals 117a, 117b, and 117c of FIG. 2) are the inputs to the switched capacitor charge summing blocks 312a, 312b, and 312c. The delay compensation feedback digital-to-analog converter output signals 209 that are the reference voltages $Vref_k$ and $Vref_{k-1}$ 207 are the inputs to the switched capacitor charge summing block 313a and 313b. All of the inputs 131, 207, 117, and 209 to the tracking quantizer 215 may be either single ended or differential signals. If they are differential signal pairs, they have two input terminals for each signal or reference voltage.

The output signals (single ended or differential) of the switched capacitor charge summing blocks 310a, 310b, 311, 312a, 312b, 312c, 313a, and 313b are connected together at the summing nodes 305. All the positive outputs are connected together in one set 301a of the summing nodes 305 and all the negative outputs are connected together in a second set 301b of the summing nodes 305. The negative outputs switched capacitor charge summing blocks 310a, 310b, 311, 312a, 312b, 312c, 313a, and 313b as connected to the second set of summing nodes 301b are connected to the negative input – of the comparator circuit 300. The positive outputs of the switched capacitor charge summing blocks 310a, 310b, 311, 312a, 312b, 312c, 313a, and 313b are connected to the positive input + of the comparator circuit 300. The positive input + of the comparator circuit 300 is connected to the gate of the NMOS transistor M1 and the negative input – is connected to the gate of the NMOS transistor M2. The first terminal of the switch SW1 is connected to the positive input + and the first terminal of the switch SW2 is connected to the negative input –. The second terminals of the switches SW1 and SW2 are connected to the midrange voltage source Vmid that is the voltage level half-way between the reference voltage power supply 240 and the ground reference voltage level. The control terminals of the switches SW1 and SW2 are connected to receive a comparator reset signal rst. When the comparator reset signal rst is activated to close the switches SW1 and SW2, the gates of the NMOS transistors M1 and M2 are precharged to the voltage level of the midrange voltage source Vmid.

The sources of the NMOS transistors M1 and M2 are connected to the drain of the NMOS transistor M7. The source of the NMOS transistor M7 is connected to the ground reference voltage level and the gate of the NMOS transistor M7 is connected to the second clock phase Φ2. The drain of the NMOS transistor M1 is connected to the source of the NMOS transistor M3 and the drain of the NMOS transistor M2 is connected to the source of the NMOS transistor M4. The drain of the NMOS transistor M3 connected to the drain of the PMOS transistor M5 and the drain of the NMOS transistor M4 connected to the drain of the PMOS transistor M6. The sources of the PMOS transistors M5 and M6 are connected to the drain of the PMOS transistor M8 and the source of the PMOS transistor M8 is connected to the power supply voltage source VDD. The gate of the PMOS transistor M8 is connected to an inverse of the second clock phase $\overline{\Phi 2}$. The gates of the NMOS transistor M3 and the PMOS transistor M5 are connected to the drains of the NMOS transistor M4 and the PMOS transistor M6. The gates of the NMOS transistor M4 and the PMOS transistor M6 are connected to the drains of the NMOS transistor M3 and the PMOS transistor M5. The connection at the gates of the NMOS transistor M4 and the PMOS transistor M6 and the drains of the NMOS transistor M3 and the PMOS transistor M5 forms the output signal Qn 320 of the comparator circuit 300. The cross coupling structure of the NMOS transistors M3 and M4 and the PMOS transistors M5 and M6 provide the positive feedback that determine the whether the feed-forward integrated differential quantization signals 117, delay compensation feedback digital-to-analog converter output signals 209, and delay compensation feedback digital-to-analog converter output signals 209 are greater than or less than the reference input voltage levels 207.

In operation, the gates of the NMOS transistors M1 and M2 are precharged to the voltage level of the midrange voltage source Vmid by activation of the comparator reset signal rst. The analog input signal cancellation inputs 131, the reference input voltage levels 207, the feed-forward integrated difference quantization signals 117 and the delay compensation feedback digital-to-analog converter output signals 209 are sampled in the switched capacitor charge summing blocks 310a, 310b, 311, 312a, 312b, 312c, 313a, and 313b and the sampled output are additively combined in the summing blocks 305 and applied to the gates of the NMOS transistors M1 and M2. This charge determines the voltage level present at the gates of the NMOS transistors M1 and M2 which in turn determines the state of the output signal Qn 320.

Figure 5:
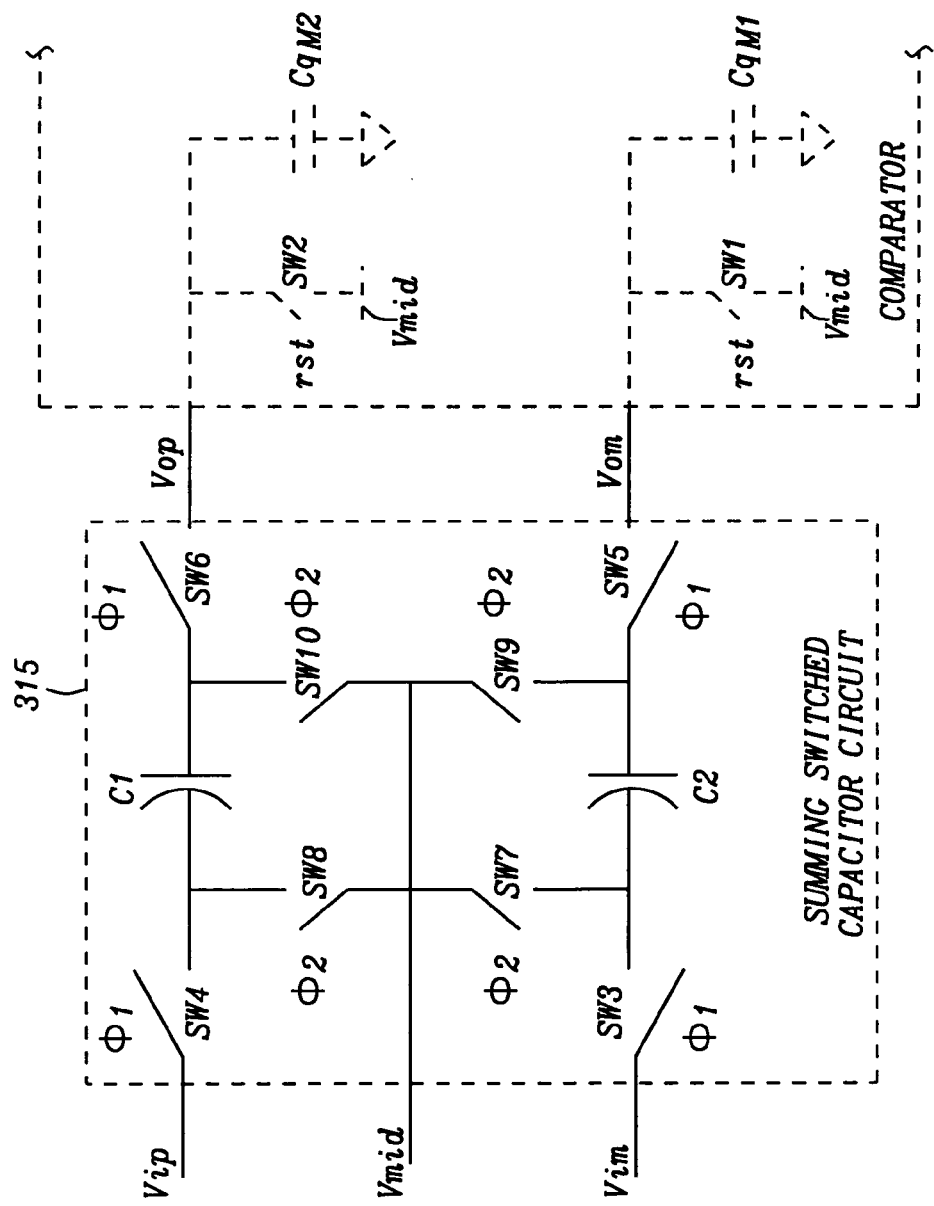
FIG. 5 is a schematic diagram of an embodiment of a switched capacitor charge summing circuit that forms the switched capacitor charge summing blocks of FIG. 4.

FIG. 5 is a schematic diagram of an embodiment of a summing switched capacitor charge summing circuit 350 that forms switched capacitor charge summing blocks 310a, 310b, 311, 312a, 312b, 312c, 313a, and 313b of FIG. 4. Referring to FIG. 5, the switched capacitor charge summing block 350 has input voltage signals that are applied as the positive input signal Vip and the negative input signal Vim. The negative input signal Vim is applied to the first terminal of the switch SW3 and the positive input signal Vip is applied to the first terminal of the switch SW4. The second terminals of the switches SW3 and SW4 are respectively connected to the first plates of the capacitors C2 and C1. The second plates of the capacitors C2 and C1 are respectively connected to the first terminals of the switches SW5 and SW6. The second terminals of the switches SW5 and SW6 are respectively to the negative output terminal Vom and the positive output terminal Vop. The first terminals of the switches SW7, SW8, SW9, and SW10 are connected to the midrange voltage source Vmid. The second terminals of the switches SW7 and SW8 respectively are connected to the first terminal of the capacitors C2 and C1 and the second terminals of the switches SW9 and SW10 respectively are connected to the second terminals of the capacitors C2 and C1. The control terminals of the switches SW3, SW4, SW5, and SW6 are connected to the first clock phase Φ1 to activate the switches SW3, SW4, SW5, and SW6. The control terminals of the switches SW7, SW8, SW9, and SW10 are connected to the second clock phase Φ2 to activate the switches SW7, SW8, SW9, and SW10. The negative output terminal Vom and the positive output terminal Vop are respectively connected to the positive input + and the negative input − of FIG. 4.

Figure 16:
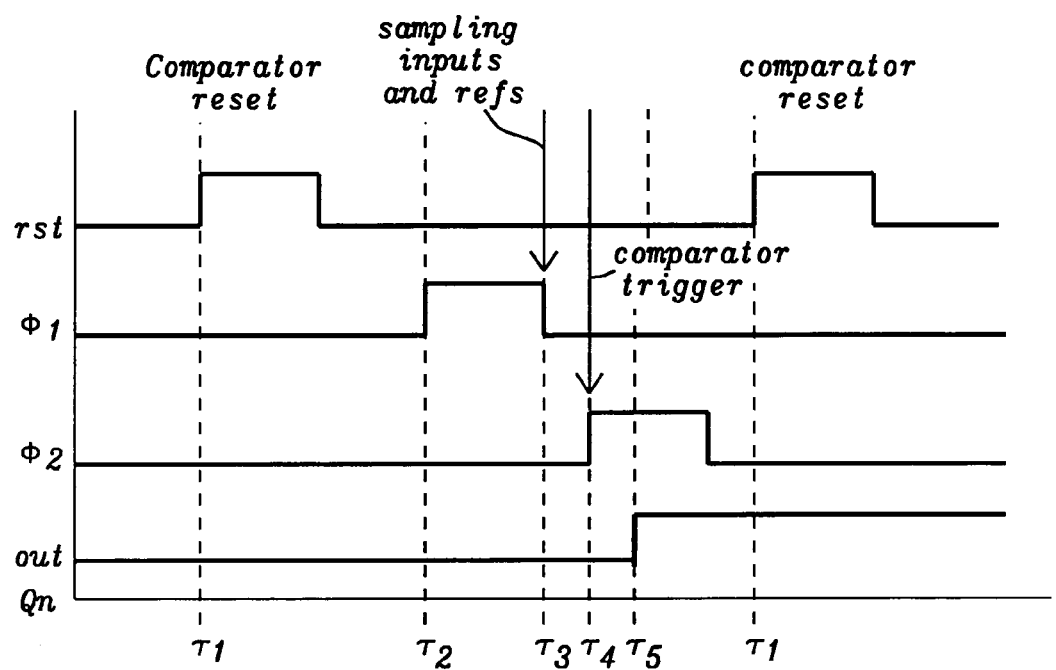
FIG. 16 is a timing diagram of the embodiments of summing-tracking-compensating quantizers of FIGS. 4 and 13.

FIG. 16 is a timing diagram of the embodiment of the summing-tracking-compensating quantizer of FIG. 4. The operation of the tracking quantizer 215 of FIG. 4, as shown in FIG. 16 begins with the comparator reset signal rst being activated at the time $\tau_1$ to reset the comparator circuit 300 by setting charging the gate capacitances $Cq_{M1}$ and $Cq_{M2}$ of FIG. 5 to the midrange voltage source Vmid. At the time $\tau_2$, the first clock phase Φ1 is activated to sample and capacitively couple the negative input signal Vim and the positive input signal Vip to the gate capacitance of the NMOS transistors M1 and M2. At the time $\tau_3$, the negative input signal Vim and the positive input signal Vip are sampled and capacitively coupled and at the time $\tau_4$, the comparator is triggered at the activation of the second clock phase Φ2. After a delay time at the time $\tau_5$, the output signal Qn 320 is valid. Also during the second clock phase Φ2 after the time $\tau_4$, the switches, SW7, SW8, SW9, and SW10 are activated and the capacitors C2 and C1 are reset to the midrange voltage source Vmid.

In FIG. 2, the unit sample delay circuit 127 is used in the signal canceling feed-forward path. In order to achieve the unit sample delay circuit 127, the sample must be held in a capacitor for one cycle time. Unfortunately, the gate capacitance of the NMOS transistor M1 and NMOS transistor M2 of the comparator circuit 300 of FIG. 4 is reset with the activation of the comparator reset signal rst after a comparator decision has been made. This may not be necessary with some embodiments of the summing switched capacitor circuit 350 of the quantizing circuits. However in the present embodiment, the sample delay may be implemented from two of the summing switched capacitor circuits 350 of the quantizing circuits of FIG. 5 as modified in FIG. 6.

Figure 6:
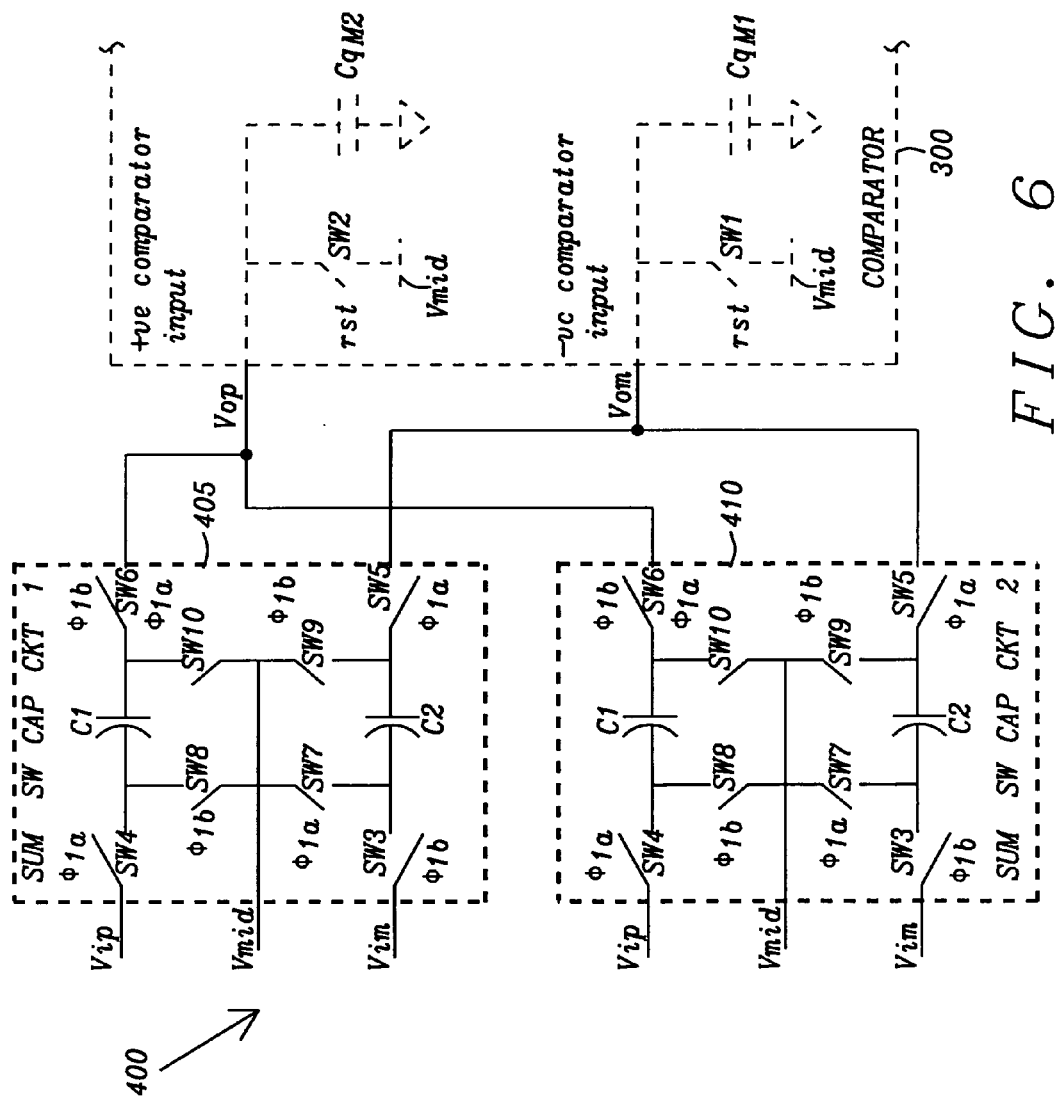
FIG. 6 is a schematic diagram of an embodiment of a switched capacitor unit delaying circuit of the quantizing circuit of FIG. 4.

FIG. 6 is a schematic diagram of an embodiment of a switched capacitor unit delaying circuit 310b of the quantizing circuit of FIG. 4. Referring to FIG. 6, the switched capacitor unit delaying circuit 400 includes two of the summing switched capacitor circuits 350 of FIG. 5. The structure and operation of the two summing switched capacitor circuits 405 and 410 is identical as those described in FIG. 5, except the switches SW4, SW5, SW7, and SW10 of the first summing switched capacitor circuit 405 and the switches SW3, SW6, SW8, and SW9 of the second summing switched capacitor circuit 410 are now controlled by the even first clock phase Φ1a. The switches SW3, SW6, SW8, and SW9 of the first summing switched capacitor circuit 405 and the switches SW4, SW5, SW7, and SW10 of the second summing switched capacitor circuit 410 are controlled by the odd first clock phase Φ1b. In operation, one of the summing switched capacitor circuits 405 or 410 will hold the sampling charge of positive input signal Vip and the negative input signal Vim for the previous period, while the other samples the positive input signal Vip and the negative input signal Vim in the current period. This requires that the first clock phase Φ1 must therefore be divided into two separate clock phases alternated between even first clock phase Φ1a and odd first clock phase Φ1b that can easily be derived from the first clock phase Φ1 as described hereinafter in FIG. 7b.

Figure 7A:
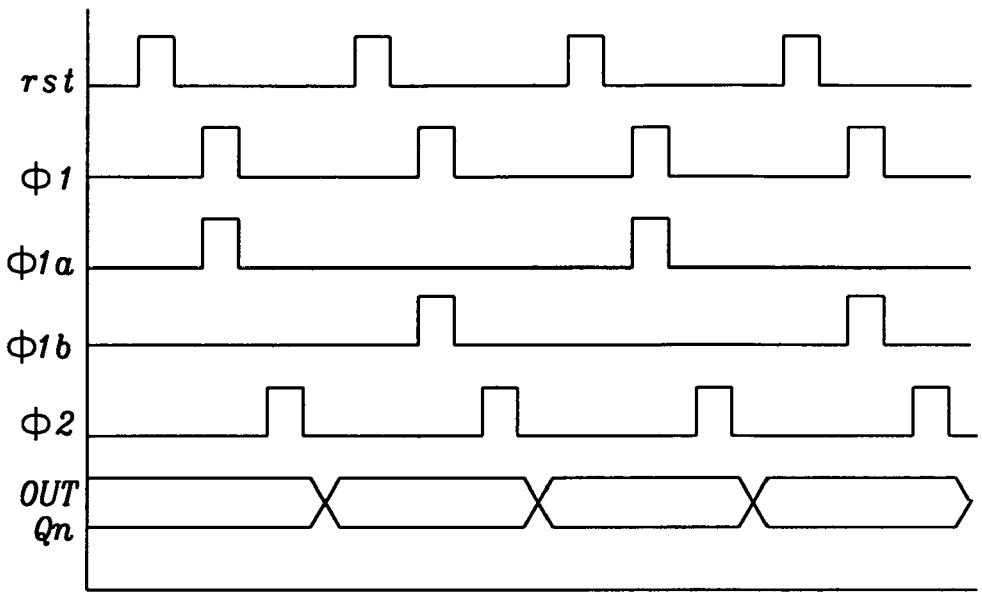
FIG. 7a is a plot of the timing relationships of the even and odd first clock phases Φ1a and Φ1b for the switched capacitor delaying circuit of FIG. 6.

FIG. 7a is a plot of the timing relationships of the even and odd first clock phases Φ1a and Φ1b for the switched capacitor delaying circuit of FIG. 6. Referring to FIG. 7a, the first clock phase Φ1 is shown as being divided into the even and odd first clock phases Φ1a and Φ1b. During the even first clock phase Φ1a, the first summing switched capacitor circuit 405 captures the sampling of the positive input signal Vip and second summing switched capacitor circuit 410 captures the negative input signal Vim. The first summing switched capacitor circuit 405 transfers the delayed charge of the negative input signal Vim to the negative output terminal Vom and the second summing switched capacitor circuit 410 transfers the delayed charge of the positive input signal Vip to the positive output terminal Vop and to the comparator circuit 300. During the odd first clock phase Φ1b, the first summing switched capacitor circuit 405 captures the negative input signal Vim and the second summing switched capacitor circuit 410 captures the sampling of the positive input signal Vip. The first summing switched capacitor circuit 405 transfers the delayed charge of the negative input signal Vim to the negative output terminal Vom and the second summing switched capacitor circuit 410 transfers the delayed charge of the positive input signal Vip to the positive output terminal Vop and to the comparator circuit 300. The second clock phase Φ2 activates the comparator for determining the state of the output signal Qn 320. After a delay time, the output signal Qn 320 is valid.

Figure 7B:
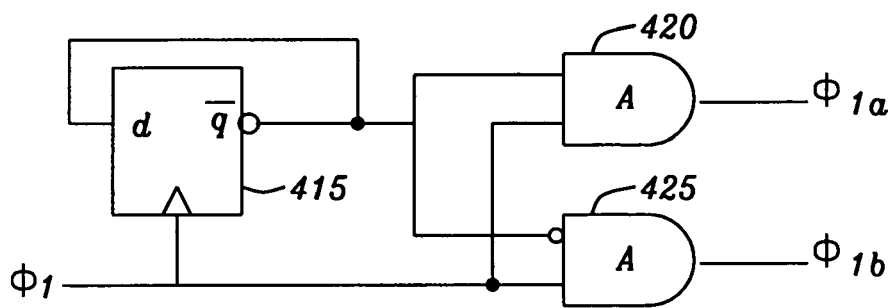
FIG. 7b is a schematic diagram for an embodiment of a circuit for generating the even and odd first clock phases Φ1a and Φ1b for the switched capacitor delaying circuit of FIG. 6.

FIG. 7b is a schematic diagram for an embodiment of a circuit for generating the even and odd first clock phases Φ1a and Φ1a for the switched capacitor delaying circuit of FIG. 6. Referring to FIG. 7b, the first clock phase Φ1 is connected to the clock terminal of the toggle flip-flop 415 that toggles from one state to the next at the receipt of the first clock phase Φ1. The out-of-phase output $\bar{q}$ of the flip-flop 415 is connected to the first input of the two input NAND gates 420 and 425. The out-of-phase output $\bar{q}$ is inverted to be in-phase for the input to the NAND gate 425. The first clock phase Φ1 is the second input of the two input NAND gates 420 and 425. The output of the of the two input NAND gate 420 is the even first clock phase cb1a and the output of the two input NAND gates 425 is the odd first clock phase Φ1b.

Returning to FIG. 3, it is apparent that the input signals 210 (the integrated difference quantization signals 117a, 117b, and 117c and the inverse analog input signal 131 of FIG. 2) and the delay compensation feedback digital-to-analog converter output signal 209 are common to each of the comparator circuits 215a, 215b, 215c, and 215d. The reference voltage output terminals 207a, 207b, 207c, and 207d of the voltage reference switching matrix circuit 205 are unique to each of the comparator circuits 215a, 215b, 215c, and 215d. The common input signals 210 and delay compensation feedback digital-to-analog converter output signal 209 are sampled and capacitively coupled to the input gate capacitance comparator circuits 215a, 215b, 215c, and 215d on the same clock phase, first clock phase Φ1. Since the references are constant, these can be sampled and capacitively coupled to the input gate capacitance of each of the comparator circuits 215a, 215b, 215c, and 215d on either the first clock phase Φ1 or the second clock phase Φ2.

Figure 8:
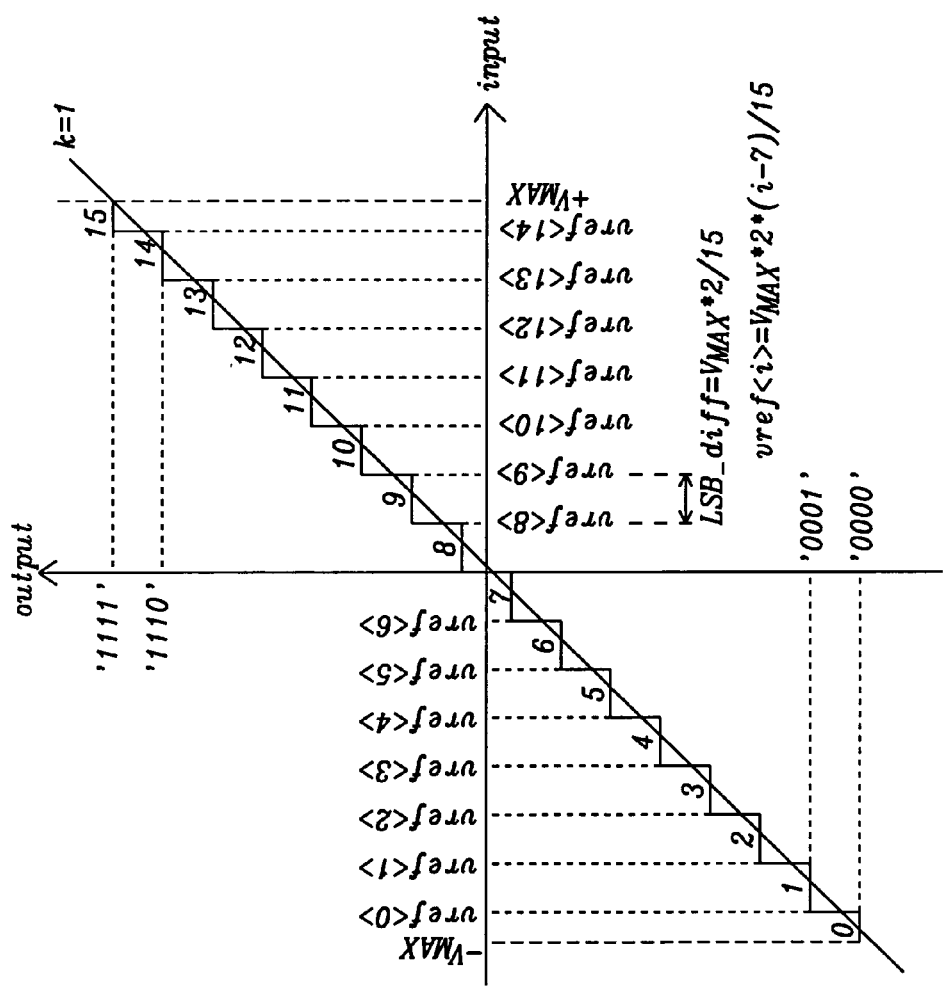
FIG. 8 is a plot of a transfer function of a mid-rise quantizing circuit of FIG. 4.

FIG. 8 is a plot of a transfer function of a mid-rise quantizer circuit of FIG. 4. The horizontal axis represents the reference voltages Vref0, Vref1, Vref2, ..., Vrefn for the comparator circuits 215a, 215b, 215c, and 215d. The vertical axis represents digital output code 155 (0000, 0001, ..., 1111) from the summation circuit 225. The gain is equal to one indicating that the voltage differential between each digit (LSB_diff) of the digital output code 155 is equal. The voltage range of the reference voltages Vref0, Vref1, Vref2, ..., Vrefn is essentially from a negative maximum voltage level $-V_{MAX}$ to a positive maximum voltage level $+V_{MAX}$. In the transfer function, as shown, the range of the reference voltages Vref0, Vref1, Vref2, ..., Vrefn is the negative maximum voltage level $-V_{MAX}$ to the positive maximum voltage level $+V_{MAX}$. The voltage differential (LSB_diff) between each digit is determined by the equation:

$$LSB\_diff = V_{MAX} * 2/15$$

Each of the reference voltages Vref0, Vref1, Vref2, ..., Vrefn are determined by the equation:

$$Vref(i) = VMAX * 2(i-7)/15$$

It should be noted that the embodiment as shown, the range reference voltages Vref0, Vref1, Vref2, ..., Vrefn is divided into sixteen partitions. The number of partitions is not fixed and may be any number.

As shown in FIG. 4 each of the comparator circuits 215 have a pair of the reference voltages (a positive reference Vrefip and a negative reference voltage, Vrefim 207) provided for the comparator. As stated above only two comparator circuits 215 are required. Two additional comparator circuits are added for overflow detection. Therefore, the two primary reference voltages are determined from the previous digital output code (k) 235 and the previous digital output code (k) 235 less one (k−1). The two overflow detection reference voltages are the previous digital output code (k) 235 plus one (k+1) and the previous digital output code (k) 235 less two (k−2). The reference voltage inputs for each of the comparator circuits 215a, 215b, 215c, and 215d is as shown in Table 1.

TABLE 1

| Comparator Circuit | Positive Reference Vrefip | Negative Reference Voltage Vrefim |
| --- | --- | --- |
| Q0 215a | Vref[k + 1] | Vref[14 − (k + 1)] |
| Q1 215b | Vref[k] | Vref[14 − k] |
| Q2 215c | Vref[k − 1] | Vref[14 − (k − 1)] |
| Q3 215d | Vref[k − 2] | Vref[14 − (k − 2)] |

Figure 9:
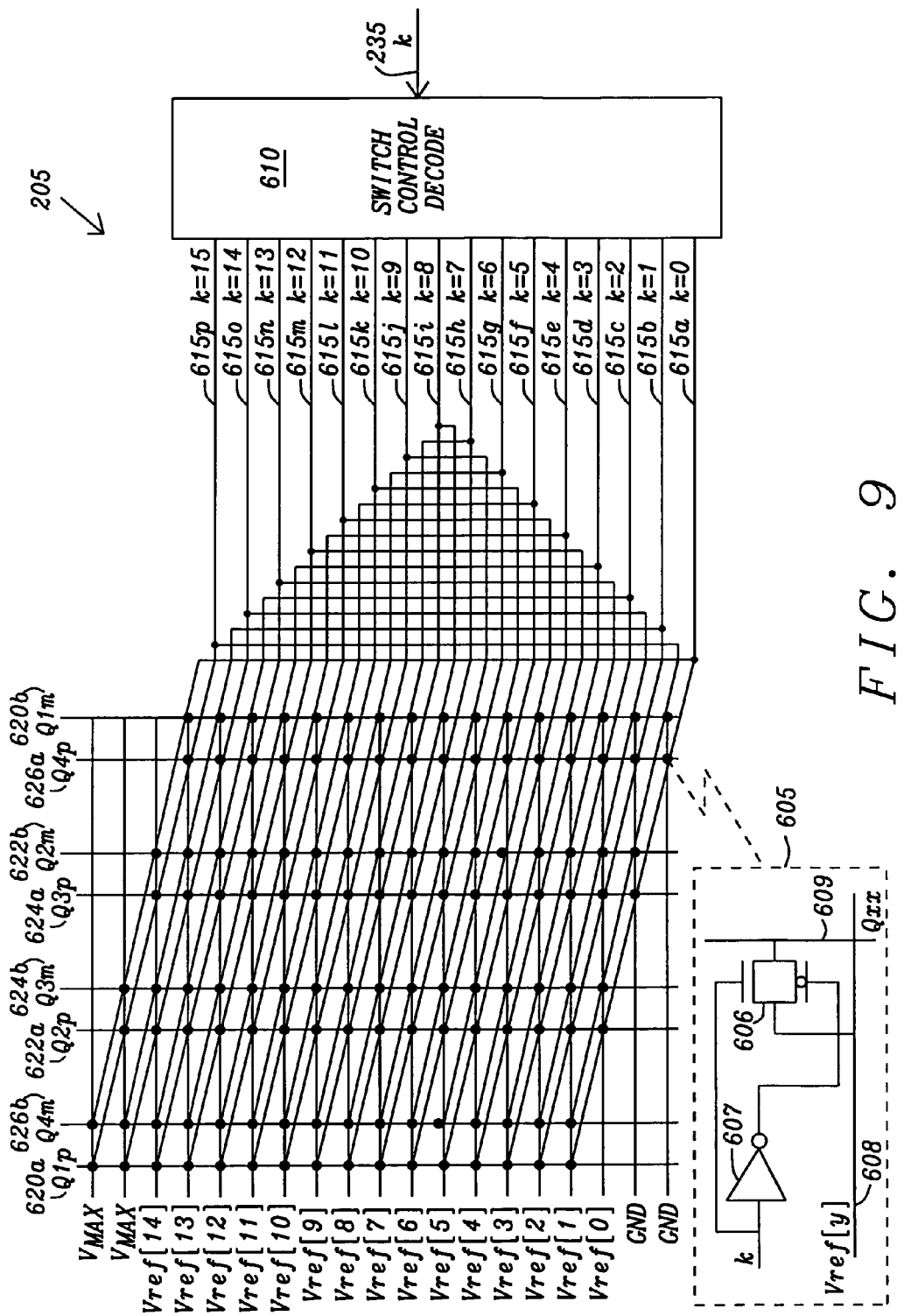
FIG. 9 is a schematic diagram of an embodiment of a switch matrix circuit for connecting selected reference voltage levels to quantizing circuits of the a summing-tracking-compensating quantizer of FIG. 3.

FIG. 9 is a schematic diagram of an embodiment of a voltage reference switching matrix circuit 205 for connecting selected reference voltages Vref0, Vref1, Vref2, ..., Vrefn to comparator circuits 215a, 215b, 215c, and 215d of the a summing-tracking-compensating quantizer of FIG. 3. The voltage reference switching matrix circuit 205 has a switching matrix 600 that is effectively a matrix of cross point switches 605 that selectively connects each of the reference voltages Vref0, Vref1, Vref2, ..., Vref14, $V_{MAX}$, and GND to the voltage reference inputs of the comparator circuits 215a, 215b, 215c, and 215d of FIG. 3. The control terminal of the cross point switches 605 are each connected to a selection terminal 615a, 615b, ..., 615p for selectively activating the cross point switches 605.

Each of the cross point switches 605 includes an NMOS and PMOS switching pair of transistors 606 connected in parallel to form the cross point switch. The gate of the PMOS transistor of the switching pair of transistors 606 is connected to the output of the inverter 607. The gate of the NMOS transistor of the switching pair of transistors 606 and the input of the inverter 607 are connected to function as the control terminal of the cross point switch 605 to receive the selection control signals k from the selection terminal 615a, 615b, ..., 615p. The reference voltage Vref[y] is connected to to the first source/drain of the switching pair of transistors 606 and the second source/drain of the switching pair of transistors 606 is connected to the output terminals Qxx to transfer the selected reference voltage Vref[y] to the appropriate comparator circuit. Each column of the matrix of the cross point switches 605 is connected to the output terminals 620a and 620b, 622a and 622b, 624a and 624b, and 626a and 626b of the switching matrix 600 for connecting the reference voltages Vref0, Vref1, Vref2, ..., Vref14, $V_{MAX}$, and GND to the comparator circuits 215a, 215b, 215c, and 215d of FIG. 3.

The previous digital output code (k) 235 is the input to the switch control and decode circuit 610. The switch control and decode circuit 610 decodes the previous digital output code 235 to select which of the control selection terminal 615a, 615b, ..., 615p to be activated. Upon activation of the selected selection terminal 615a, 615b, ..., 615p the cross point switch connected to the selection terminal 615a, 615b, ..., 615p is activated transferring the selected reference voltages Vref0, Vref1, Vref2, ..., Vref14, $V_{MAX}$, and GND to the output terminals 620a and 620b, 622a and 622b, 624a and 624b, and 626a and 626b for transfer to the comparator circuits 215a, 215b, 215c, and 215d of FIG. 3.

FIG. 10 is a table of the switch matrix connectivity of FIG. 9 for the reference voltage levels to the quantizing circuits. Each column of the table shows the reference voltage Vref[i] that is applied to each of the output terminals Q1p 620a and Q1m 620b, Q2p 622a and Q2m622b, Q3p 624a and Q3m624b, and Q4p 626a and Q4m626b. Each row of the table shows the reference voltage Vref[i] that are applied to one output terminal Q1p 620a, Q1m620b, Q2p 622a, Q2m622b, Q3p 624a, Q3m 624b, Q4p 626a, or Q4m626b. For instance, if the previous digital output code k 235 is 0011 (3) the output terminal Q1p 620a is set to reference voltage Vref[4], output terminal Q1m620b is set to reference voltage Vref[10], output terminal Q2p 622a is set to reference voltage Vref[3], output terminal Q2m622b is set to reference voltage Vref[11], output terminal Q3p 624a is set to reference voltage Vref[2], output terminal Q3m624b is set to reference voltage Vref[12], output terminal Q4p 626a is set to reference voltage Vref[1], and output terminal Q4m626b is set to reference voltage Vref[13]. The designation 'b0 represent the ground reference voltage GND and the designation 'b1 represents the power supply voltage source VDD.

In FIG. 9, each reference voltages Vref0, Vref1, Vref2, ..., Vref14, $V_{MAX}$, and GND is connected to each comparator circuit 215a, 215b, 215c, and 215d of FIG. 3 through the cross point switches 605. This creates an embodiment with a large number of the cross point switches 605 in the matrix (4×15×2=128 switches). If the connectivity of the reference voltages Vref0, Vref1, Vref2, ..., Vref14, $V_{MAX}$, and GND were to be reshuffled such that each of the pair of the reference voltages Vref0, Vref1, Vref2, ..., Vref14, 0.9VDD, and GND is connected to one pair of the output terminals Q1p 620a and Q1m620b, Q2p 622a and Q2m622b, Q3p 624a and Q3m624b, or Q4p 626a and Q4m626b and thus to one of the comparator circuits 215a, 215b, 215c, and 215d of FIG. 3, a much more efficient switching matrix embodiment can be implemented.

Figure 11:
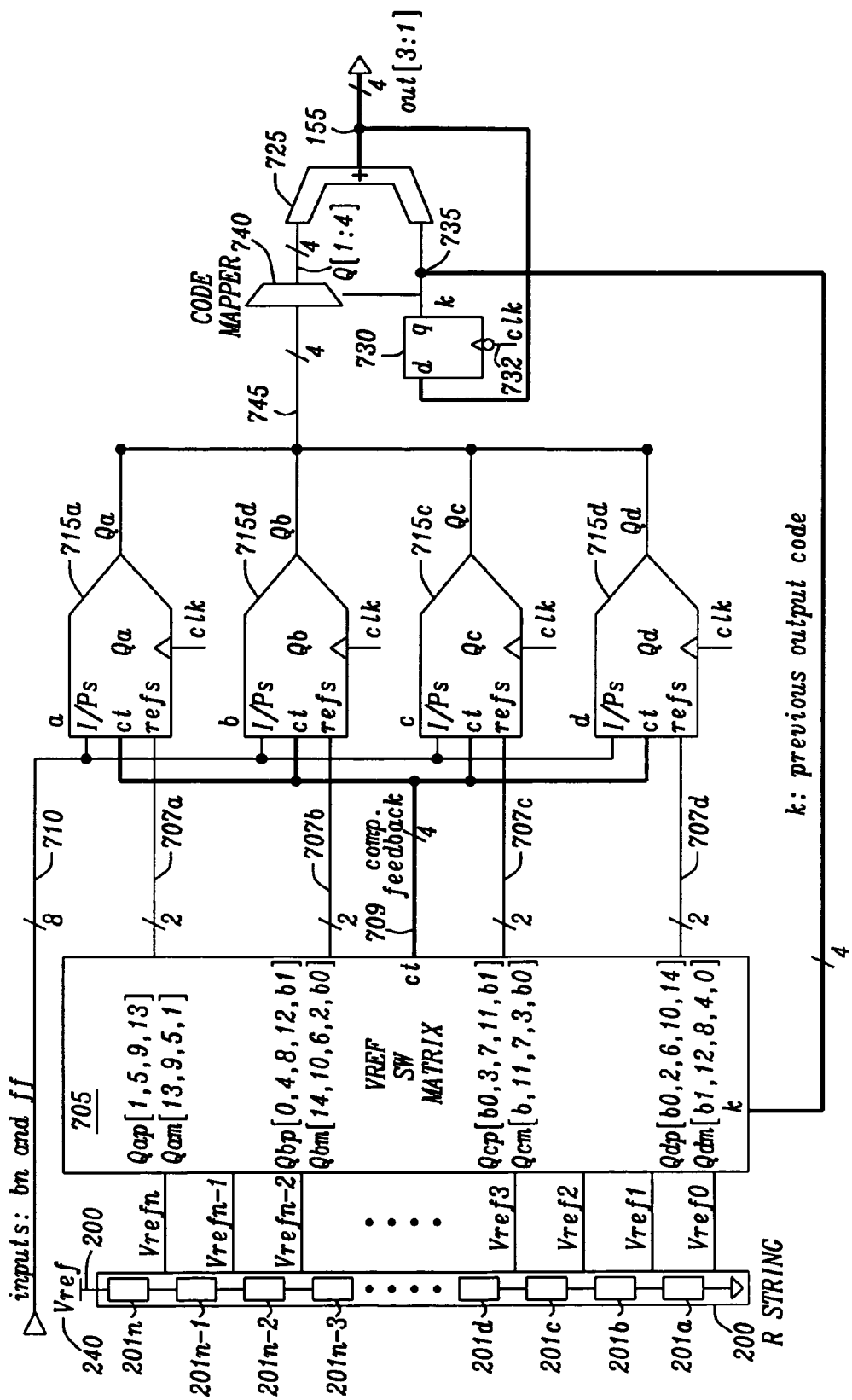
FIG. 11 is a schematic diagram of another embodiment of a summing-tracking-compensating quantizer for employing a reshuffled switching matrix and a comparator circuit output select.

FIG. 11 is a schematic diagram of another embodiment of a summing-tracking-compensating quantizer for employing a reshuffled switching matrix and a comparator circuit output select. Referring now to FIG. 11 for a discussion of the summing-tracking-compensating quantizer 120. The reference voltage generator 200 consists of a resistor string 201a, 201b, ..., 201n connected between the ground reference voltage level and the reference voltage power supply 240. The resistor string 201a, 201b, ..., 201n forms a voltage divider such that at the terminals separating each of the resistors of the resistor string 201a, 201b, ..., 201n provides one of the reference voltages Vref0, Vref1, Vref2, ..., Vrefn for the comparator circuits 715a, 715b, 715c, and 715d.

The terminals of the resistor string 201a, 201b, ..., 201n that provide the reference voltages Vref0, Vref1, Vref2, ..., Vrefn are connected to the inputs of the voltage reference switching matrix circuit 705. The voltage reference switching matrix circuit 705 receives the previous digital output code 735 that controls the selection of the reference voltages Vref0, Vref1, Vref2, ..., Vrefn to be transferred to the reference voltage output terminals 707a, 707b, 707c, and 707d of the voltage reference switching matrix circuit 705 and then to the reference inputs of the four comparator circuits 715a, 715b, 715c, and 715d. The shuffled reference voltage output terminals 707a, 707b, 707c, and 707d are appropriately selected and combined employing the addition of the ½ charge from the selected immediate upper reference voltage level and selected immediate lower reference voltage level of the reference voltage resistor string 201a, is 201b, ..., 201n as selected by the voltage reference switching matrix circuit 705. This combination provides the delay compensation feedback digital-to-analog converter output signal 709. The delay compensation feedback digital-to-analog converter output signal 709 is distributed to each of the delay compensation inputs of the four comparator circuits 715a, 715b, 715c, and 715d.

The input signals 710 are compared to the reference voltages present on the reference voltage output terminals 707a, 707b, 707c, and 707d to determine the unmapped differential quantization code 745 that is the output of the four comparator circuits 715a, 715b, 715c, and 715d. The unmapped differential quantization code 745 is applied to the code mapper 740. The code mapper 740 rearranges the unmapped differential quantization code 745 into the correct order of the mapped differential quantization code 720 based on the previous digital output code 735. The mapped differential quantization code 720 is applied to one set of inputs of the summation circuit 725 and the previous digital output code 735 is applied to the second set of inputs of the summation circuit 725 to generate the digital output code 155 representative of the amplitude of the analog input signal 105 of FIG. 2. The current digital output code 155 is retained by the previous code register 730 when the clock signal 732 is activated. The retained current digital output code becomes the previous digital output code 235 during a following sampling of the quantization signals.

Figure 12A:
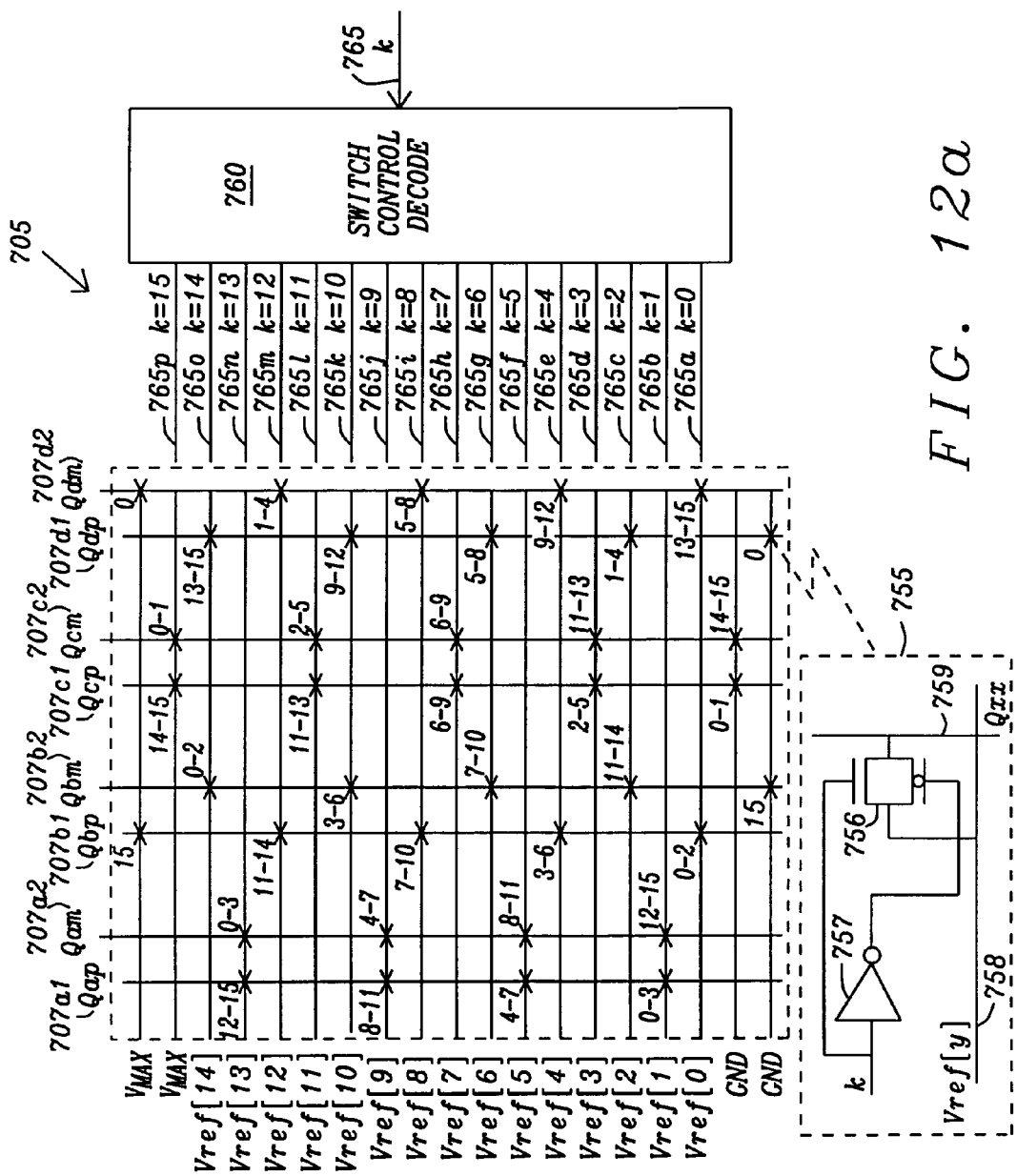
FIG. 12a is a schematic diagram of the embodiment of a switch matrix circuit for connecting selected reference voltage levels to the comparator circuits of the a summing-tracking-compensating quantizer of FIG. 11.

FIG. 12a is a schematic diagram of the embodiment of the switch matrix circuit 705 for connecting selected reference voltage levels Vref0, Vref1, Vref2, ..., Vrefn to the comparator circuits 715a, 715b, 715c, and 715d of the a summing-tracking-compensating quantizer of FIG. 11. Each of the reference voltages Vref0, Vref1, Vref2, ..., Vref14, $V_{MAX}$, and GND is connected to one of the pairs of output terminals Qap 707a1 and Qam 707a2, Qbp 707b1 and Qbm 707b2, Qcp 707c1 and Qcm 707c2, or Qdp 707d1 and Qdm 707d2 through the cross point switches 755.

Each of the cross point switches 755 includes an NMOS and PMOS switching pair of transistors 756 connected in parallel to form the cross point switch. The gate of the PMOS transistor of the switching pair of transistors 756 is connected to the output of the inverter 757. The gate of the NMOS transistor of the switching pair of is transistors 756 and the input of the inverter 757 are connected to function as the control terminal of the cross point switch 705 to receive the selection control signals k from the selection terminal 765a, 765b, ..., 765p. The reference voltage Vref[y] is connected to the first source/drain of the switching pair of transistors 756 and the second source/drain of the switching pair of transistors 756 is connected to the output terminals Qxx 759 to transfer the selected reference voltage Vref[y] to the appropriate comparator circuit. Each column of the matrix of the cross point switches 705 is connected to the pairs of output terminals Qap 707a1 and Qam 707a2, Qbp 707b1 and Qbm 707b2, Qcp 707c1 and Qcm 707c2, and Qdp 707d1 and Qdm 707d2 of the switching matrix 750 for connecting the reference voltages Vref0, Vref1, Vref2, . . . , Vref14, $V_{MAX}$, and GND to the comparator circuits 715a, 715b, 715c, and 715d of FIG. 11.

The previous digital output code (k) 735 is the input to the switch control and decode circuit 760. The switch control and decode circuit 760 decodes the previous digital output code 735 to select which of the control selection terminal 765a, 765b, . . . , 765p to be activated. Upon activation of the selected selection terminal 765a, 765b, . . . , 765p the cross point switch 755 connected to the control selection terminal 765a, 765b, 765p is activated transferring the selected reference voltages Vref0, Vref1, Vref2, . . . , Vref14, $V_{MAX}$, and GND to the output terminals Qap 707a1, Qam 707a2, Qbp 707b1, Qbm 707b2, Qcp 707c1, Qcm 707c2, Qdp 707d1, and Qdm 707d2 for transfer to the comparator circuits 715a, 715b, 715c, and 715d of FIG. 11. The numbers adjacent to each of the cross point switches represents the previous digital output code (k) 735 that activate the associated switch.

FIG. 13 is a table of the switch matrix connectivity of FIG. 12a for the reference voltage levels to the quantizing circuits of FIG. 11. Each column of the table shows the reference voltage Vref[i] that is applied to each of the output terminals Qap 707a1, Qam 707a2, Qbp 707b1, Qbm 707b2, Qcp 707c1, Qcm 707c2, Qdp 707d1, and Qdm 707d2. Each row of the table shows the reference voltage Vref[i] that are applied to one output terminals Qap 707a1, Qam 707a2, Qbp 707b1, Qbm 707b2, Qcp is 707c1, Qcm 707c2, Qdp 707d1, or Qdm 707d2. For instance, if the previous digital output code (k) 735 is equal to 0110 (6), the output terminal Qap 707a1 is connected to reference voltage Vref[5]; Qam 707a2 is connected to reference voltage Vref[9]; the output terminal Qbp 707b1 is connected to reference voltage Vref[4]; the output terminal Qbm 707b2 is connected to reference voltage Vref[10]; Qcp 707c1 is connected to reference voltage Vref[7]; the output terminal Qcm 707c2 is connected to reference voltage Vref[7]; and the output terminal Qdp 707d1 is connected to reference voltage Vref[6]; Qdm 707d2 is connected to reference voltage Vref[8]. The designation 'b0 represent the ground reference voltage GND and the designation 'b1 represents the power supply voltage source VDD.

The table of FIG. 13 illustrates the connectivity to the switch matrix 750 of FIG. 12a for sixteen reference voltage levels Vref0, Vref1, Vref2, . . . , Vref14, $V_{MAX}$, and GND. In general the reference voltage levels Vref0, Vref1, Vref2, . . . , Vref14, $V_{MAX}$, and GND connected to the switch matrix 750 and thus to the comparators are selected according to the following function:

$Q_{Mp}$=ref[k−$Q_n$+2]

$Q_{Mn}$=ref[$R_N$−1−k+$Q_N$−2]   EQ. 1

Where:
k is the previous digital output code.
$R_N$ is the number of the plurality voltage references.
N is the number of the plurality of comparators where N∈{1 . . . $R_N$}.
$Q_M$ is the $M^{th}$ comparator where M∈{1 . . . N}.
$Q_{Mp}$ is an identifier of the $M^{th}$ positive comparator.
$Q_{Mn}$ is an identifier of the $M^{th}$ negative comparator.

Figure 12B:
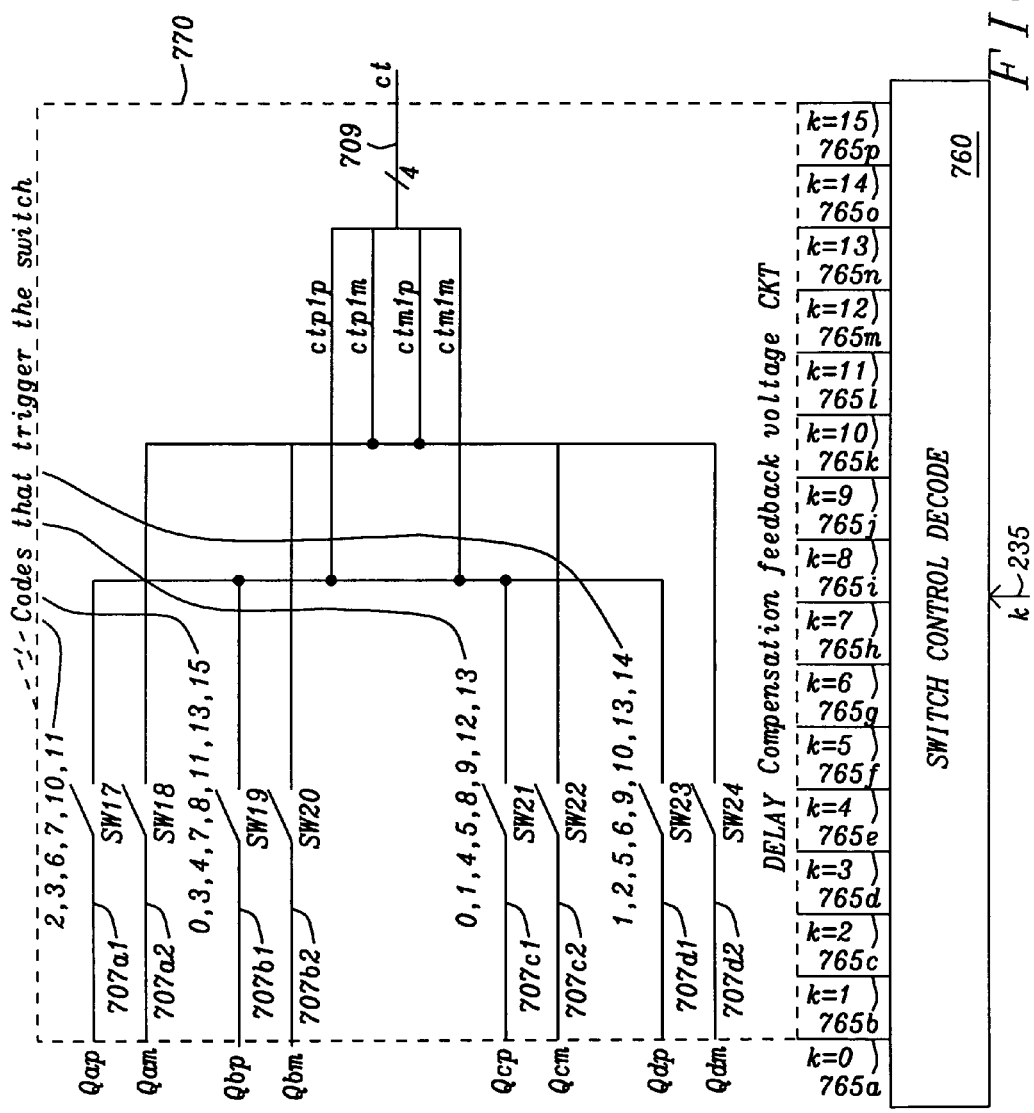
FIG. 12b is a schematic diagram of a second embodiment of a delay compensation feedback switching circuit for connecting selected reference voltage levels to the comparator circuits of the a summing-tracking-compensating quantizer of FIG. 11.

FIG. 12b is a schematic diagram of an embodiment of a delay compensation feedback switching circuit for connecting selected reference voltage levels to the comparator circuits of the a summing-tracking-compensating quantizer of FIG. 11. Since the reference voltages Vref0, Vref1, Vref2, . . . , Vref14, $V_{MAX}$, and GND are shuffled in their position at the output terminals Qap 707a1, Qam 707a2, Qbp is 707b1, Qbm 707b2, Qcp 707c1, Qcm 707c2, Qdp 707d1, and Qdm 707d2, the delay compensation feed back digital to analog converter is no longer simply the additive combination of the reference voltages Vref0, Vref1, Vref2, . . . , Vref14, $V_{MAX}$, and GND present at the two center reference voltage output terminals 207a, 207b, 207c, and 207d by combining ½ the charge from the immediate upper reference voltage level 207b and immediate lower reference voltage level 207c of FIG. 3. The appropriate output terminals Qap 707a1, Qam 707a2, Qbp 707b1, Qbm 707b2, Qcp 707c1, Qcm 707c2, Qdp 707d1, and Qdm 707d2 must be similarly combined. With the shuffling, the correct output terminals Qap 707a1, Qam 707a2, Qbp 707b1, Qbm 707b2, Qcp 707c1, Qcm 707c2, Qdp 707d1, and Qdm 707d2 must be selected for the additive combining. To accomplish this selection, the delay compensation feedback voltage circuit 770 is incorporated in the voltage reference switching matrix circuit 705. Each of the output terminals Qap 707a1, Qam 707a2, Qbp 707b1, Qbm 707b2, Qcp 707c1, Qcm 707c2, Qdp 707d1, and Qdm 707d2 are connected respectively to the switches SW17, SW18, SW19, SW20, SW21, SW22, SW23, and SW24. The output selection terminals 765a, 765b, 765p of the switch control decode circuit 760 provide the selection control signals k for activating the switches SW17, SW18, SW19, SW20, SW21, SW22, SW23, and SW24 for selectively applying the reference voltages Vref0, Vref1, Vref2, . . . , Vref14, $V_{MAX}$, and GND to the delay compensation feedback digital-to-analog converter output signal 709. The selection control signals for k=2, 3, 6, 7, 10, and 11 from the selection terminal 765c, 765d, 765g, 765h, 765k, and 765l are connected to the control terminals SW 17 and SW18. The selection control signals for k=0, 3, 4, 7, 8, 11, 12, and 15 from the selection terminal 765a, 765d, 765e, 765h, 765i, 765l, 765m, and 765p are connected to the control terminals SW 19 and SW20. The selection control signals for k=0, 1, 4, 5, 8, 9, 12, and 13 from the selection terminal 765a, 765b, 765e, 765f, 765i, 765j, 765m, and 765n are connected to the control terminals SW 21 and SW22. The selection control signals for k=1, 2, 5, 6, 9, 10, 13, and 14 from the selection terminal 765b, 765c, 765f, 765g, 765j, 765k, 765n, and 765o are connected to the control terminals SW 23 and SW24. The selective activation of the switches SW17, SW18, SW19, SW20, SW21, SW22, SW23, and SW24 provides the differential voltage references to the delay compensation feedback digital-to-analog converter output signal 709 that are additively combined as described above to provide the delay compensation feedback for the tracking quantizer.

Returning to FIG. 11, the output terminals Qap 707a, Qbp 707b, Qcp 707c, Qcm 707c, and Qdp 707d are connected to the reference input (refs) of the comparator circuits 715a, 715b, 715c, and 715d. The delay compensation feedback digital-to-analog converter output signals 709 are connected to the delay compensation feed back input (ct) of the comparator circuits 715a, 715b, 715c, and 715d. The integrated difference quantization signals 710 are applied to the signal inputs of the comparator circuits 715a, 715b, 715c, and 715d. The comparator circuits 715a, 715b, 715c, and 715d are structured and function as described in FIG. 4, except the outputs of the comparator circuits 715a, 715b, 715c, and 715d are now the unmapped differential quantization code 745 that are applied as inputs to the code mapper 740. The code mapper 745 is a selector circuit that has its selector terminal connected to receive the previous digital output code k 735.

The previous digital output code k 735 is decoded to rearrange the unmapped differential quantization code 745 unmapped differential quantization code 745 into the mapped differential quantization code 720.

FIG. 14 is a table for mapping the unmapped differential quantization code 745 from the comparator circuits 715a, 715b, 715c, and 715d of FIG. 11 to the appropriate digit locations at the output of the code mapper 740 for determining the mapped differential quantization code 720 of the summing continuous-time Sigma-Delta Analog-to-Digital Converter. Each column of the table represents one of the previous digital output codes k 735. Each row is the mapped digit location for the mapped quantization code 720 based on the previous digital output code k 735. For example, if the previous digital output code k 735 is equal to six (0110), the output Qa of the comparator circuit 715a is mapped to the mapped code digit Q3. The output Qb of the comparator circuit 715b is mapped to the mapped code digit Q4. The output Qc of the comparator circuit 715c is mapped to the mapped code digit Q1. The output Qd of the comparator circuit 715d is mapped to the mapped code digit Q2.

The generalized mapping function performed by the code mapper 740 for output terminals 745 of the comparator circuits 715a, 715b, 715c, and 715d to generate the correct mapped quantization code 720 that is transferred to the summation devices are selected according to the following mapping function:

$Q_M$ maps to comparator $Q_{1+\{M-1-k\} \, Modulus \, N}$.

Where:
k is the previous digital output code.
N is the number of the plurality of comparators where $N \epsilon \{1 \ldots R_N\}$.
$Q_M$ is the $M^{th}$ comparator where $M \epsilon \{1 \ldots N\}$.

Figure 15:
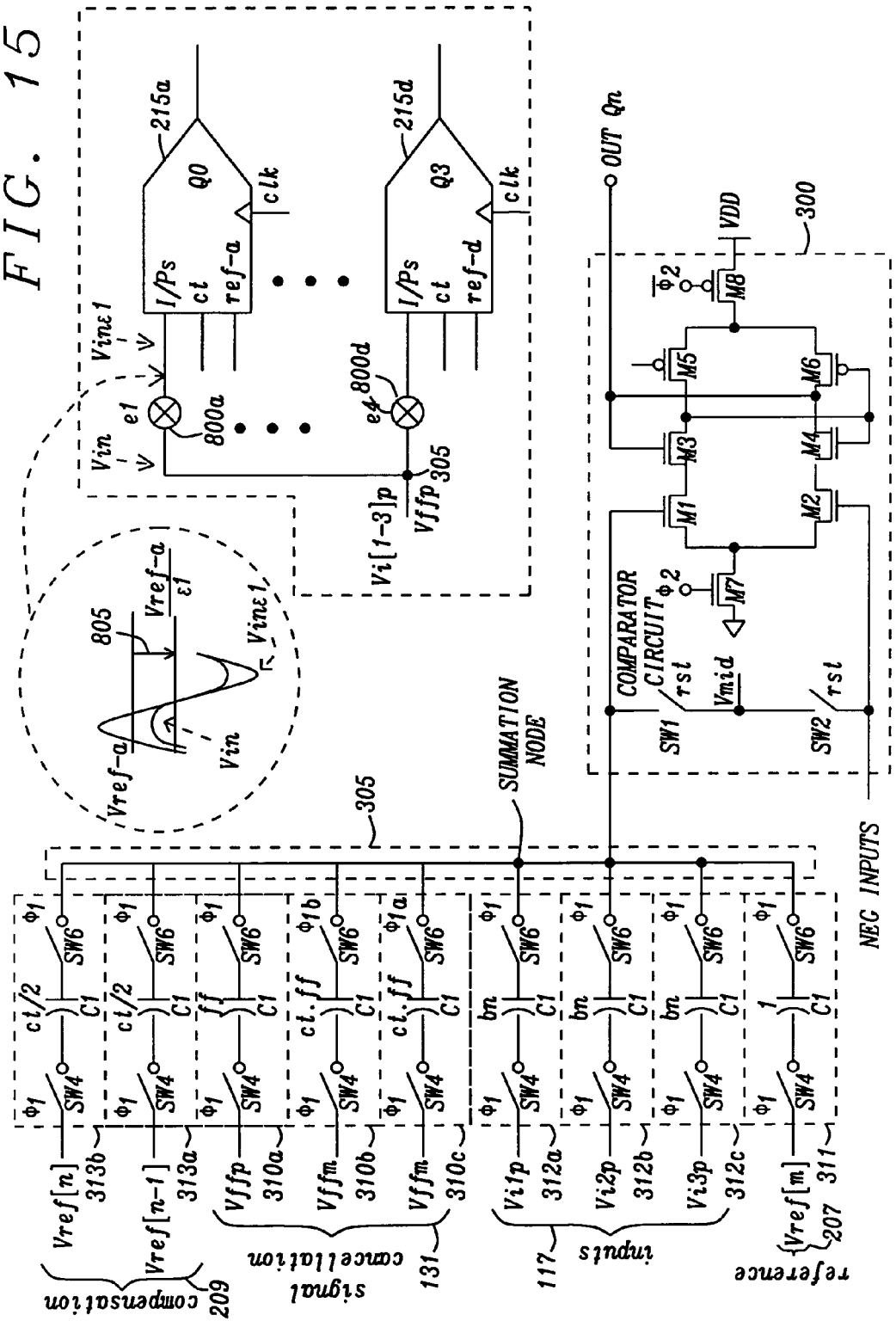
FIG. 15 is a schematic of the a summing-tracking-compensating quantizer of FIG. 3 illustrating the separate summing switched capacitor and switched capacitor unit delaying circuits of the quantizing circuit of FIG. 4 for discussing errors resulting from mismatches in feed forward paths.

FIG. 15 is a schematic of the a summing-tracking-compensating quantizer of FIG. 3 illustrating the separate summing switched capacitor and switched capacitor unit delaying circuits of the quantizing circuit of FIG. 4 for discussing errors resulting from mismatches in feed forward paths. FIG. 15 illustrates the positive channel of a quantizer during the coupling phases. The replication of the common input blocks common summing switched capacitor circuits 310a, 312a, 312b, 312c, and switched capacitor unit delaying circuits 310b and 310c causes a mismatch in each of the comparator circuits 215a, 215b, 215c, and 215d. The mismatches are equivalent to an error scaling factor, En 800a, ..., 800d. This effectively introduces a different gain in each comparator, which can also be seen as a shift in each comparator reference Vref-a by an amount of 1/εn 805. This is because, mathematically, the following two statements are equivalent, $sgn(Vin \times \epsilon_n - Vref) = sgn(Vin - Vref/\epsilon_n)$ where
sgn is the sign operator In the embodiment of the switching matrix 705 of FIG. 13a, the reference errors are static. The analog-to-digital conversion loop will minimize the reference offsets, and so will the mismatch between the multiple feed-forward paths for a given coefficient as long as the error is less than half a reference step size.

FIG. 16b shows the timing diagram for the clock phases comparator reset signal rst, first clock phase Φ1, and second clock phase Φ2 for the comparator circuits 300 FIG. 15. The comparator circuit 300 is structured and functions as shown in FIG. 4 as discussed above. At the time $\tau_1$, the comparator reset signal rst becomes active and the gates of the NMOS transistors M1 and M2 of the comparator 300 are precharged to the voltage level of the midrange voltage source Vmid. At the time $\tau_2$, the first clock phase Φ1 is activate and the delay compensation feedback digital-to-analog converter output signals 209, analog input signal cancellation input signals 131, feed-forward integrated difference quantization signals 117, and the reference input voltage levels 207 are transferred to the summation node 305 at the gates of the NMOS transistors M1 and M2. At the time $\tau_3$, the first clock phase Φ1 is deactivated to hold the sampled input signals. At the time $\tau_4$, the second clock phase Φ2 is activated and the comparator 300 is triggered to determine the digital output code Qn of the comparator 300. The digital output code Qn becomes valid at the time $\tau_5$. It should be noted that since the reference input voltage levels 207 are constant, the sampled reference input voltage levels 207 can be coupled into the comparator 300 on either the first clock phase Φ1 or the second clock phase Φ2, but this is only valid if the inversion of charge is accounted for with one phase or the other.

Figure 17:
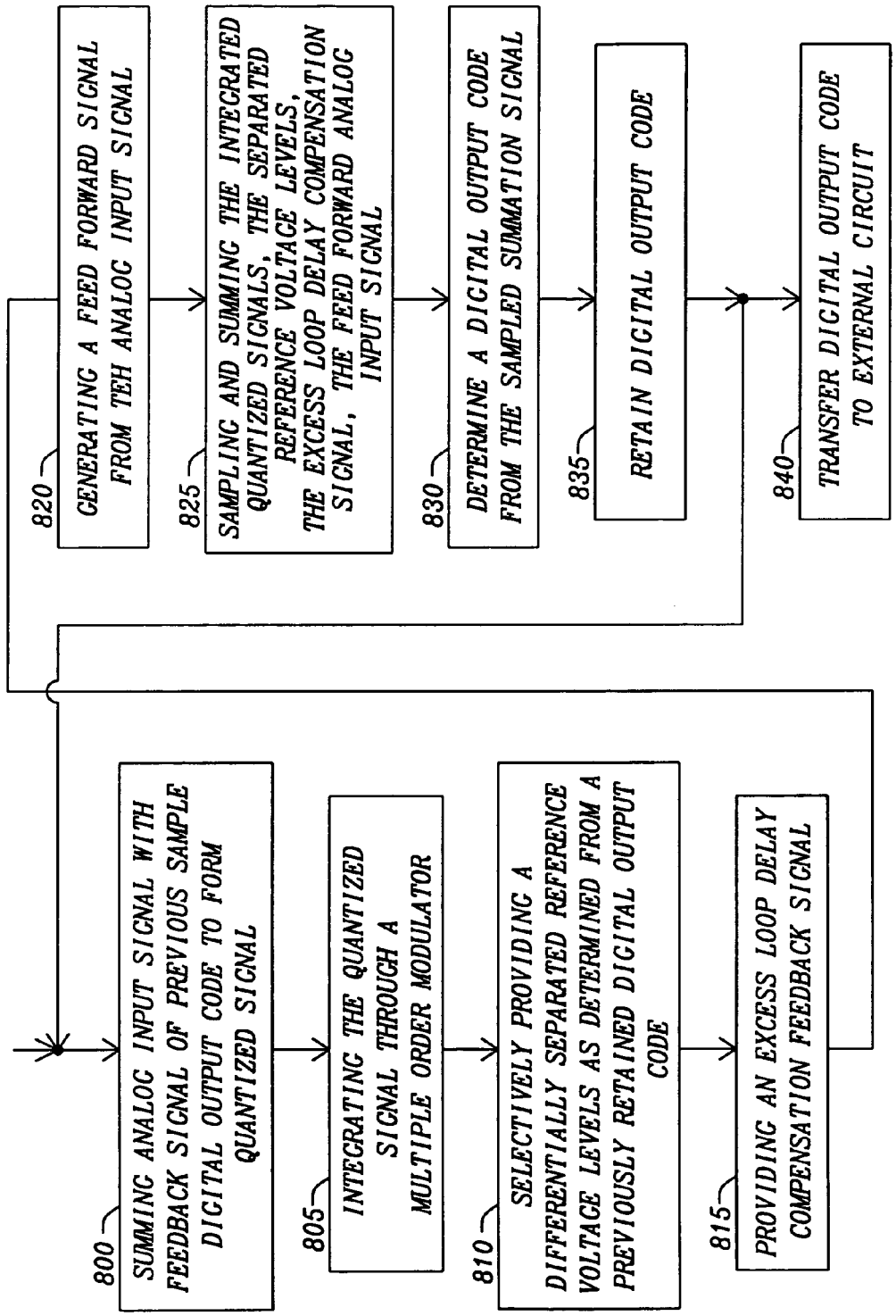
FIG. 17 is a flowchart of an embodiment for a continuous-time Sigma-Delta Analog-to-Digital Conversion method.

FIG. 17 is a flowchart of an embodiment for a continuous-time Sigma-Delta Analog-to-Digital Conversion method. An analog input signal is additively combined is (Box 800) with an analog feedback signal converted from a previously retained digital output code to form a quantized signal. The quantization signal is integrated (Box 805) through a multiple order modulator. Separated reference voltage levels are provided (Box 810) for comparison with the integrated quantized signal. The separated reference voltage levels are determined by the previously retained digital output code. A loop delay compensation feedback signal is provided (Box 815) to fully restore the effect of loop delay in the conversion method. The loop delay compensation feedback signal is the previously retained digital output code converted to an analog signal by combination of the selected differentially separated reference voltage levels. The effect of the loop delay is also compensated for by generating (Box 820) a feed forward delay cancellation input signal from the analog input signal.

The integrated quantized signal, the separated reference voltage levels, loop delay compensation feedback signal, and the feed forward delay cancellation input signal from the analog input signal are sampled, held, and additively combined (Box 825) to form a sampled summation charge signal. The sampled summation charge signal is applied to a comparator circuit that is triggered as a result of the sampled summation charge signal to determine (Box 830) the present digital output code. The digital output code is retained (Box 835) for feedback to the input to determine the quantization difference signal, for transfer to determine the differentially separated reference voltage levels, and conversion to an analog signal as the loop delay compensation feedback signal. The present digital output code is transferred to external circuitry for further processing.

While this invention has been particularly shown and described with reference to the preferred embodiments thereof, it will be understood by those skilled in the art that various changes in form and details may be made without departing from the spirit and scope of the invention.

The invention claimed is:

1. A sigma-delta analog-to-digital converter comprising;
a summing tracking quantizer comprising:
an additive combining circuit for summing multiple integrated signals of cascaded integrator stages of the sigma-delta analog-to-digital converter; and
a reference voltage generation circuit for selectively providing tracking reference voltages for comparison with the summed integrated signals, creating an loop delay compensation signal based on a retained previous digital output code of the sigma-delta analog-todigital converter, and transferring the loop delay compensation signal to the additive combining circuit to be additively combined with the integrated signals to compensate for loop delay.

2. The sigma-delta analog-to-digital converter of claim 1 wherein the summing tracking quantizer further comprises a plurality of comparator circuits in communication with the additive combining circuit for receiving the summed multiple integrated signals and in communication with the reference voltage generation circuit to receive the tracking reference voltages for comparison with the summed multiple integrated signals to determine the present digital output code.

3. The sigma-delta analog-to-digital converter of claim 1 wherein the additive combining circuit receives a scaled sampled analog signal, and a delayed scaled analog input signal that are summed with the multiple integrated signals to cancel presence of an input signal that is transferred through the cascaded integrator stages.

4. The sigma-delta analog-to-digital converter of claim 1 wherein the reference voltage generation circuit comprises:
a plurality of reference voltage sources arranged such that a voltage level of each of the reference voltage sources is distributed between a first power supply voltage source and a second power supply voltage source;
a matrix switch connected to the plurality of reference voltage sources such that tracking reference voltages are transferred from selected reference voltage source to the comparator circuits as determined by the retained previous digital output code.

5. The sigma-delta analog-to-digital converter of claim 4 wherein the matrix switch comprises:
a plurality of cross point switches, each cross point switch including:
a first terminal connected to one of the tracking reference voltages,
a second terminal connected to be in communication with one input of one of the comparator circuits, and
a control terminal receiving the previous digital output code to determine which of the tracking reference voltages are connected to the inputs of the plurality of comparator circuits.

6. The sigma-delta analog-to-digital converter of claim 5 wherein the plurality of cross point switches is arranged in rows and columns such that each input of the plurality of comparator circuits is connected to the second terminal of a number of cross point switches equal to the number of tracking voltage references.

7. The sigma-delta analog-to-digital converter of claim 6 wherein the reference voltage sources are connected to the cross point switches and thus to the comparator circuits are selected according to the following function:

$$Q_{Mp} = \text{ref}[k - Q_n + 2]$$

$$Q_{Mn} = \text{ref}[R_N - 1 - k + Q_N - 2]$$

Where:
k is the previous digital output code,
$R_N$ is the number of the plurality voltage references,
N is the number of the plurality of comparators where N∈{1 . . . RN},
$Q_M$ is the $M^{th}$ comparator where M∈{1 . . . N},
$Q_{Mp}$ is an identifier of the $M^{th}$ positive comparator,
$Q_{Mn}$ is an identifier of the $M^{th}$ negative comparator.

8. The sigma-delta analog-to-digital converter of claim 6 wherein the number of the plurality of comparator circuits is four and the tracking reference voltages in communication with the plurality comparators are selected according to the following function:

| Comparator | Positive Reference Qxp | Negative Reference Qxm |
|---|---|---|
| Q1y: | Ref[k + 1] | Ref[14 − (k + 1)] |
| Q2y: | Ref[k] | Ref[14 − (k)] |
| Q3y: | Ref[k − 1] | Ref[14 − (k − 1)] |
| Q4y: | Ref[k − 2] | Ref[14 − (k − 2)] |

Where:
Qxy is an identifier of the comparator and whether it is an in phase or out of phase input for the comparator,
k is the digital output code for the previous sample of the analog input signal,
N is the total number of reference voltage levels generated by the voltage reference generator.

9. The sigma-delta analog-to-digital converter of claim 5 wherein the plurality of cross point switches is arranged such that each tracking reference voltage is connected to a first cross point switch with its second terminal in communication with a terminal of a first polarity of one of the plurality of comparator circuits and to a second cross point switch with its second terminal in communication with a terminal of a second polarity of one of the plurality of comparator circuits.

10. The sigma-delta analog-to-digital converter of claim 9 wherein output terminals of the comparator circuits are selected to create the digital output code according to the following mapping function:

$$Q_M \text{ maps to comparator } Q_{1+\{M-1-k\} \, Modulus \, N}.$$

Where:
k is the previous digital output code,
N is the number of the plurality of comparators where N∈{1 . . . $R_N$},
$Q_M$ is the $M^{th}$ comparator where M∈{1 . . . N}.

11. The sigma-delta analog-to-digital converter of claim 1 wherein the plurality of comparator circuits includes four comparators that determine if input signals of the summing tracking quantizer and input signals of the comparator circuits have varied by −2, −1, 0, +1, +2 of the reference levels from a previous sampling of the analog input signal.

12. The sigma-delta analog-to-digital converter of claim 1 wherein at least one of the tracking reference voltages is the loop delay compensation feedback signal based on the previous digital output code.

13. The sigma-delta analog-to-digital converter of claim 12 wherein a first tracking reference voltage equal to a voltage level of the previous digital output code to form the loop delay compensation feedback signal.

14. The sigma-delta analog-to-digital converter of claim 12 wherein the first tracking reference voltage and a second tracking reference voltage as determined by the previous digital output code are scaled by a dividing factor and additively combined to form the loop delay compensation feedback signal.

15. The sigma-delta analog-to-digital converter of claim 1 wherein the summing-tracking quantizer further comprises an accumulator for additively combining a differential quantization code from the outputs of the plurality of comparator circuits with the previous digital output code to generate the present output code.

16. The sigma-delta analog-to-digital converter of claim 9 wherein the summing-tracking quantizer further comprises an accumulator for additively combining a differential quantization code from the outputs of the plurality of comparator circuits with the previous digital output code to generate the present output code.

17. The sigma-delta analog-to-digital converter of claim 16 wherein the outputs of the plurality of comparator circuits are an unmapped differential quantization code and the summing-tracking quantizer further comprises a code mapper that reorganizes the unmapped differential quantization code into a mapped differential quantization code that is applied the accumulator.

18. The sigma-delta analog-to-digital converter of claim 15 wherein the summing-tracking quantizer further comprises a previous output code storage device where the present digital output code is stored for application in a next sampling of the analog input signal.

19. A summing tracking quantizer comprising:
an additive combining circuit for summing multiple integrated signals of cascaded integrator stages of a summing tracking quantizer;
a reference voltage generation circuit for selectively providing tracking reference voltages for comparison with the summed integrated signals, creating an loop delay compensation signal based on a retained previous digital output code of the summing tracking quantizer, and transferring the loop delay compensation signal to the additive combining circuit to be additively combined with the integrated signals to compensate for loop delay; and
a plurality of comparator circuits in communication with the additive combining circuit for receiving the summed multiple integrated signals and in communication with the reference voltage generation circuit to receive the tracking reference voltages for comparison with the summed multiple integrated signals to determine the present digital output code.

20. The summing tracking quantizer of claim 19 wherein the additive combining circuit receives a scaled sampled analog signal, and a delayed scaled analog input signal that are summed with the multiple integrated signals to form a compensated summed integrated signals.

21. The summing tracking quantizer of claim 19 wherein the reference voltage generation circuit comprises:
a plurality of reference voltage sources arranged such that a voltage level of the each of the reference voltage sources is distributed between a first power supply voltage source and a second power supply voltage source;
a matrix switch connected to the plurality of reference voltage sources such that tracking reference voltages are transferred from selected reference voltage source to the comparator circuits as determined by the retained previous digital output code.

22. The summing tracking quantizer of claim 21 wherein the matrix switch comprises:
a plurality of cross point switches, each cross point switch including:
a first terminal connected to one of the tracking reference voltages,
a second terminal connected to be in communication with one input of one of the comparator circuits, and
a control terminal receiving the previous digital output code to determine which of the tracking reference voltages are connected to the inputs of the plurality of comparator circuits.

23. The summing tracking quantizer of claim 22 wherein the plurality of cross point switches is arranged in rows and columns such that each input of the plurality of comparator circuits is connected to the second terminal of a number of cross point switches equal to the number of tracking voltage references.

24. The summing tracking quantizer of claim 23 wherein the reference voltage sources are connected to the cross point switches and thus to the comparator circuits are selected according to the following function:

$Q_{Mp} = \text{ref}[k-Q_n+2]$ $Q_{Mn} = \text{ref}[R_N-1-k+Q_N-2]$

Where:
k is the previous digital output code,
$R_N$ is the number of the plurality voltage references,
N is the number of the plurality of comparators where $N \in \{1 \ldots R_N\}$,
$Q_M$ is the $M^{th}$ comparator where $M \in \{1 \ldots N\}$,
$Q_{Mp}$ is an identifier of the $M^{th}$ positive comparator,
$Q_{Mn}$ is an identifier of the $M^{th}$ negative comparator.

25. The summing tracking quantizer of claim 22 wherein the number of the plurality of comparator circuits is four and the tracking reference voltages in communication with the plurality comparators are selected according to the following function:

| Comparator | Positive Reference Qxp | Negative Reference Qxm |
|---|---|---|
| Q1y: | Ref[k + 1] | Ref[14 − (k + 1)] |
| Q2y: | Ref[k] | Ref[14 − (k)] |
| Q3y: | Ref[k − 1] | Ref[14 − (k − 1)] |
| Q4y: | Ref[k − 2] | Ref[14 − (k − 2)] |

Where:
Qxy is an identifier of the comparator and whether it is an in phase or out of phase input for the comparator,
k is the digital output code for the previous sample of the analog input signal,
N is the total number of reference voltage levels generated by the voltage reference generator.

26. The summing tracking quantizer of claim 22 wherein the plurality of cross point switches is arranged such that each tracking reference voltage is connected to a first cross point switch with its second terminal in communication with a terminal of a first polarity of one of the plurality of comparator circuits and to a second cross point switch with its second terminal in communication with a terminal of a second polarity of one of the plurality of comparator circuits.

27. The summing tracking quantizer of claim 26 wherein output terminals of the comparator circuits are selected to create the digital output code according to the following mapping function:

$Q_M$ maps to comparator $Q_{1+\{M-1-k\}\ Modulus\ N}$,

Where:
k is the previous digital output code,
N is the number of the plurality of comparators where $N \in \{1 \ldots R_N\}$,
$Q_M$ is the $M^{th}$ comparator where $M \in \{1 \ldots N\}$.

28. The summing tracking quantizer of claim 19 wherein the plurality of comparator circuits includes four comparators that determine if the analog input signal has varied by −2, −1, 0, +1, +2 of the reference levels from a previous sampling of the analog input signal.

29. The summing tracking quantizer of claim 19 wherein at least one of the tracking reference voltages is the loop delay compensation feedback signal based on the previous digital output code.

30. The summing tracking quantizer of claim 29 wherein a first tracking reference voltage equal to a voltage level of the previous digital output code to form the loop delay compensation feedback signal.

31. The summing tracking quantizer of claim 29 wherein the first tracking reference voltage and a second tracking reference voltage as determined by the previous digital output code are scaled by a dividing factor and additively combined to form the loop delay compensation feedback signal.

32. The summing tracking quantizer of claim 19 further comprising an accumulator for additively combining a differential quantization code from the outputs of the plurality of comparator circuits with the previous digital output code to generate the present output code.

33. The summing tracking quantizer of claim 26 wherein the summing-tracking quantizer further comprises an accumulator for additively combining a differential quantization code from the outputs of the plurality of comparator circuits with the previous digital output code to generate the present output code.

34. The summing tracking quantizer of claim 33 wherein the outputs of the plurality of comparator circuits are an unmapped differential quantization code and the summing-tracking quantizer further comprises a code mapper that reorganizes the unmapped differential quantization code into a mapped differential quantization code that is applied the accumulator.

35. The summing tracking quantizer of claim 32 further comprising a previous output code storage device where the present digital output code is stored for application in a next sampling of the analog input signal.

36. A reference voltage generation circuit comprising:
a plurality of output terminals connected for selectively providing reference voltages and creating an analog signal based on a digital input code;
a plurality of reference voltage sources arranged such that the voltage levels of the reference voltage sources are distributed between a first power supply voltage source and a second power supply voltage source for providing each of the reference voltages to one of the plurality of output terminals; and
a matrix switch connected to the plurality of reference voltage sources such that tracking reference voltages are transferred from selected reference voltage source as determined by the digital input code and at least one of the reference voltage source is designated as the output signal as decoded from the digital input code.

37. The reference voltage generation circuit of claim 36 wherein the matrix switch comprises:
a plurality of cross point switches, each cross point switch including:
a first terminal connected to one of the reference voltages sources,
a second terminal in communication with one output terminals, and
a control terminal for receiving an activation signal established by the digital input code to determine which of the reference voltages are connected to selected output terminals.

38. The reference voltage generation circuit of claim 37 wherein the plurality of cross point switches is arranged in rows and columns such that each input of the plurality of comparator circuits is connected to the second terminal of a number of cross point switches equal to the number of reference voltages.

39. The reference voltage generation circuit of claim 34 wherein the reference voltage sources are connected to the cross point switches according to the following function:

$Q_{Mp} = \text{ref}[k - Q_n + 2]$ $Q_{Mn} = \text{ref}[R_N - 1 - k + Q_N - 2]$

Where:
k is the previous digital output code,
$R_N$ is the number of the plurality voltage references,
N is the number of the plurality of comparators where $N \in \{1 \ldots R_N\}$,
$Q_M$ is the $M^{th}$ comparator where $M \in \{1 \ldots N\}$,
$Q_{Mp}$ is an identifier of the $M^{th}$ positive comparator.
$Q_{Mn}$ is an identifier of the $M^{th}$ negative comparator.

40. The reference voltage generation circuit of claim 37 wherein the number of output terminals is four and the reference voltages in communication with the output terminals are selected according to the following function:

| Comparator | Positive Reference Qxp | Negative Reference Qxm |
|---|---|---|
| Q1y: | Ref[k + 1] | Ref[14 − (k + 1)] |
| Q2y: | Ref[k] | Ref[14 − (k)] |
| Q3y: | Ref[k − 1] | Ref[14 − (k − 1)] |
| Q4y: | Ref[k − 2] | Ref[14 − (k − 2)] |

Where:
Qxy is an identifier of the output terminals and whether it is an in phase or out of phase output terminal,
k is the digital output code for the previous sample of the analog input signal,
N is the total number of reference voltages generated by the voltage reference generator.

41. The reference voltage generation circuit of claim 36 wherein the plurality of cross point switches is arranged such that each reference voltage is connected to a first cross point switch with its second terminal in communication with the output terminal of a first polarity and to a second cross point switch with its second terminal in communication with the output terminal of a second polarity.

42. The reference voltage generation circuit of claim 41 wherein output terminals of the comparator circuits are selected to create the digital output code according to the following mapping function:

$Q_M$ maps to comparator $Q_{1 + \{M - 1 - k\} \, Modulus \, N}$.

Where:
k is the previous digital output code,
N is the number of the plurality of comparators where $N \in \{1 \ldots R_N\}$,
$Q_M$ is the $M^{th}$ comparator where $M \in \{1 \ldots N\}$.

43. The reference voltage generation circuit of claim 36 wherein a first tracking reference voltage equal to a voltage level of the digital input code to form the analog signal.

44. The reference voltage generation circuit of claim 43 wherein the first reference voltage and a second reference voltage as determined by the digital input code are scaled by a dividing factor and additively combined to form the loop delay compensation feedback signal.

45. An analog-to-digital conversion method comprising:
summing an analog input signal with a feedback analog signal from a previous sample digital output code to form a signal;
integrating the signal through multiple orders of the integration;

providing separated reference voltage levels based on the number of increments that define a range of voltage increments that can be converted by the analog-to-digital conversion method;

generating an loop delay compensation feedback signal from the multiple reference voltage levels based on the previous digital output code;

generating a scaled and delayed feed forward signal from the analog input signal;

summing the integrated signal, the separated reference voltage levels, the loop delay compensation feedback signal, and the scaled and delayed feed forward signal;

sampling the integrated signal, the separated reference voltage levels, the loop delay compensation feedback signal, and the scaled and delayed feed forward signal; and determining the digital output code from the summed and sampled integrated signal, the separated reference voltage levels, the loop delay compensation feedback signal, and the scaled and delayed feed forward signal; and retaining the digital output code for a next determining of the digital output code from the signal.

46. The analog-to-digital conversion method of claim 45 wherein generating the separated reference voltage levels comprises:

generating a plurality of reference voltage levels arranged such that the reference voltage levels are distributed between a first power supply voltage level and a second power supply voltage level for providing each of the reference voltage levels; and providing a matrix switch connected to receive the reference voltage levels and transfer the selected reference voltage level as the separated reference voltage levels as determined by the previous digital output code;

providing at least one of the reference voltage level as the loop delay compensation feedback signal as decoded from the previous digital output code.

47. The analog-to-digital conversion method of claim 46 wherein the matrix switch comprises:

a plurality of cross point switches, each cross point switch including:

a first terminal connected to receive one of the reference voltages levels, a second terminal for transferring the selected reference voltage levels as the separated reference voltage levels, and a control terminal for receiving an activation signal established by the previous digital output code to determine which of the reference voltages levels are to be the separated reference voltage levels.

48. The analog-to-digital conversion method of claim 47 wherein the plurality of cross point switches is arranged in rows and columns such that each separated reference voltage levels provided at the second terminal of a number of cross point switches equal to the number of reference voltages.

49. The analog-to-digital conversion method of claim 48 further comprising connecting the reference voltage sources to the cross point switches according to the following function:

$$Q_{Mp} = \text{ref}[k - Q_n + 2]$$

$$Q_{Mn} = \text{ref}[R_N - 1 - k + Q_N - 2]$$

Where:
k is the previous digital output code,
$R_N$ is the number of the plurality voltage references,
N is the number of the plurality of comparators where $N \in \{1 \ldots R_N\}$,
$Q_M$ is the $M^{th}$ comparator where $M \in \{1 \ldots N\}$.
$Q_{Mp}$ is an identifier of the $M^{th}$ positive comparator.
$Q_{Mn}$ is an identifier of the $M^{th}$ negative comparator.

50. The analog-to-digital conversion method of claim 47 wherein the number of separated reference voltage levels is four and the reference voltage levels are selected according to the following function:

| Comparator | Positive Reference Qxp | Negative Reference Qxm |
|---|---|---|
| Q1y: | Ref[k + 1] | Ref[14 − (k + 1)] |
| Q2y: | Ref[k] | Ref[14 − (k)] |
| Q3y: | Ref[k − 1] | Ref[14 − (k − 1)] |
| Q4y: | Ref[k − 2] | Ref[14 − (k − 2)] |

Where:
Qxy is an identifier of the separated reference voltage levels and whether it is an in phase or out of phase voltage level of the separated reference voltage levels,
k is the previous digital output code,
N is the total number of reference voltage levels generated.

51. The analog-to-digital conversion method of claim 47 wherein the plurality of cross point switches is arranged such that each reference voltage level is connected to a first cross point switch with its second terminal providing a first polarity of the separated reference voltage levels and to a second cross point switch with its second terminal providing a second polarity separated reference voltage levels.

52. The analog-to-digital conversion method of claim 51 further comprising selecting output terminals of the comparator circuits to create the digital output code according to the following mapping function:

$$Q_M \text{ maps to comparator } Q_{1+\{M-1-k\} \text{ Modulus } N}.$$

Where:
k is the previous digital output code.
N is the number of the plurality of comparators where $N \in \{1 \ldots R_N\}$.
$Q_M$ is the $M^{th}$ comparator where $M \in \{1 \ldots N\}$.

53. The analog-to-digital conversion method of claim 47 wherein the separated reference voltage levels is equal to a first voltage level of the previous digital output code decoded to form the loop delay compensation feedback signal.

54. The analog-to-digital conversion method of claim 53 wherein the first reference voltage level and a second reference voltage as determined by the previous digital output code are scaled by a dividing factor and additively combined to form the loop delay compensation feedback signal.

55. An analog-to-digital conversion apparatus comprising:

means for summing an analog input signal with a feedback analog signal from a previous sample digital output code to form a signal;

means for integrating the signal through multiple orders of the integration;

means for providing separated reference voltage levels based on the number of increments that define a range of voltage increments that can be converted by the analog-to-digital conversion apparatus;

means for generating an loop delay compensation feedback signal from the multiple reference voltage levels based on the previous digital output code;

means for generating a scaled and delayed feed forward signal from the analog input signal;

means for summing the integrated signal, the separated reference voltage levels, the loop delay compensation feedback signal, and the scaled and delayed feed forward signal;

means for sampling the integrated signal, the separated reference voltage levels, the loop delay compensation feedback signal, and the scaled and delayed feed forward signal; and means for determining the digital output code from the summed and sampled integrated signal, the separated reference voltage levels, the loop delay compensation feedback signal, and the scaled and delayed feed forward signal; and means for retaining the digital output code for a next determining of the digital output code from the signal.

56. The analog-to-digital conversion apparatus of claim 55 wherein means for generating the separated reference voltage levels comprises:

means for generating a plurality of reference voltage levels arranged such that the reference voltage levels are distributed between a first power supply voltage level and a second power supply voltage level for providing each of the reference voltage levels; and means for providing a matrix switch connected to receive the reference voltage levels and transfer the selected reference voltage level as the separated reference voltage levels as determined by the previous digital output code;

means for providing at least one of the reference voltage level as the loop delay compensation feedback signal as decoded from the previous digital output code.

57. The analog-to-digital conversion apparatus of claim 56 wherein the matrix switch comprises:

a plurality of cross point switches, each cross point switch including:

a first terminal connected to receive one of the reference voltages levels, a second terminal for transferring the selected reference voltage levels as the separated reference voltage levels, and a control terminal for receiving an activation signal established by the previous digital output code to determine which of the reference voltages levels are to be the separated reference voltage levels.

58. The analog-to-digital conversion apparatus of claim 57 wherein the plurality of cross point switches is arranged in rows and columns such that each separated reference voltage levels provided at the second terminal of a number of cross point switches equal to the number of reference voltages.

59. The analog-to-digital conversion apparatus of claim 48 further comprising means for connecting the reference voltage sources to the cross point switches according to the following function:

$Q_{Mp} = \text{ref}[k - Q_n + 2]$ $Q_{Mn} = \text{ref}[R_N - 1 - k + Q_N - 2]$

Where:
k is the previous digital output code,
$R_N$ is the number of the plurality voltage references,
N is the number of the plurality of comparators where $N \in \{1 \ldots R_N\}$,
$Q_M$ is the $M^{th}$ comparator where $M \in \{1 \ldots N\}$.
$Q_{Mp}$ is an identifier of the $M^{th}$ positive comparator.
$Q_{Mn}$ is an identifier of the $M^{th}$ negative comparator.

60. The analog-to-digital conversion apparatus of claim 57 wherein the number of separated reference voltage levels is four and the reference voltage levels are selected according to the following function:

| Comparator | Positive Reference Qxp | Negative Reference Qxm |
|---|---|---|
| Q1y: | Ref[k + 1] | Ref[14 − (k + 1)] |
| Q2y: | Ref[k] | Ref[14 − (k)] |
| Q3y: | Ref[k − 1] | Ref[14 − (k − 1)] |
| Q4y: | Ref[k − 2] | Ref[14 − (k − 2)] |

Where:
Qxy is an identifier of the separated reference voltage levels and whether it is an in phase or out of phase voltage level of the separated reference voltage levels,
k is the previous digital output code,
N is the total number of reference voltage levels generated.

61. The analog-to-digital conversion apparatus of claim 57 wherein the plurality of cross point switches is arranged such that each reference voltage level is connected to a first cross point switch with its second terminal providing a first polarity of the separated reference voltage levels and to a second cross point switch with its second terminal providing a second polarity separated reference voltage levels.

62. The analog-to-digital conversion apparatus of claim 51 further comprising means for selecting output terminals of the comparator circuits to create the digital output code according to the following mapping function:

$Q_M$ maps to comparator $Q_{1+\{M-1-k\} \text{ Modulus } N}$.

Where:
k is the previous digital output code,
N is the number of the plurality of comparators where $N \in \{1 \ldots R_N\}$,
$Q_M$ is the $M^{th}$ comparator where $M \in \{1 \ldots N\}$.

63. The analog-to-digital conversion apparatus of claim 57 wherein the separated reference voltage levels is equal to a first voltage level of the previous digital output code decoded to form the loop delay compensation feedback signal.

64. The analog-to-digital conversion apparatus of claim 63 wherein the first reference voltage level and a second reference voltage as determined by the previous digital output code are scaled by a dividing factor and additively combined to form the loop delay compensation feedback signal.

* * * * *